US008866000B2

(12) United States Patent
DiDomenico

(10) Patent No.: US 8,866,000 B2
(45) Date of Patent: Oct. 21, 2014

(54) ULTRA-EFFICIENT ENERGY CONVERSION DEVICE FOR CONVERTING LIGHT TO ELECTRICITY BY RECTIFYING SURFACE PLASMON POLARITONS

(75) Inventor: Leo D. DiDomenico, Livermore, CA (US)

(73) Assignee: Corey A. Weiss, Monsey, NY (US)

( * ) Notice: Subject to any disclaimer, the term of this patent is extended or adjusted under 35 U.S.C. 154(b) by 1059 days.

(21) Appl. No.: 12/848,128

(22) Filed: Jul. 31, 2010

(65) Prior Publication Data

US 2011/0023941 A1   Feb. 3, 2011

Related U.S. Application Data

(60) Provisional application No. 61/273,304, filed on Jul. 31, 2009, provisional application No. 61/308,542, filed on Feb. 26, 2010.

(51) Int. Cl.
| | | |
|---|---|---|
| H01L 31/00 | (2006.01) | |
| H01L 31/042 | (2014.01) | |
| H01L 31/052 | (2014.01) | |
| H01L 31/0352 | (2006.01) | |

(52) U.S. Cl.
CPC ........ *H01L 31/0522* (2013.01); *H01L 31/0352* (2013.01); *Y02E 10/52* (2013.01); *Y10S 977/762* (2013.01); *Y10S 977/948* (2013.01)
USPC ........... 136/246; 136/244; 136/251; 136/256; 307/151; 359/316; 977/762; 977/948

(58) Field of Classification Search
USPC ........... 136/243–265; 250/200; 257/431–466; 977/948–950, 953; 307/151
See application file for complete search history.

(56) References Cited

U.S. PATENT DOCUMENTS

| | | | | |
|---|---|---|---|---|
| 6,441,298 | B1 * | 8/2002 | Thio | 136/250 |
| 7,501,572 | B1 * | 3/2009 | Rabinowitz | 136/246 |
| 2008/0093529 | A1 | 4/2008 | Miles | |
| 2008/0165437 | A1 * | 7/2008 | DiDomenico | 359/728 |
| 2008/0178867 | A1 * | 7/2008 | DiDomenico | 126/573 |
| 2008/0295882 | A1 * | 12/2008 | Stephens et al. | 136/244 |
| 2009/0308443 | A1 * | 12/2009 | Cutler | 136/256 |

* cited by examiner

*Primary Examiner* — Jonathan Johnson
*Assistant Examiner* — Andrew Golden
(74) *Attorney, Agent, or Firm* — Leighton K. Chong

(57) ABSTRACT

An ultra-efficient device for converting light into electricity has a dielectric medium for input light propagation, a metallic medium having an array of surface-plasmon-polariton (SPP) resonator cavities formed at nano-scale and distributed in the metallic medium below the dielectric-metal interface, each nano-scale resonator cavity having a hollow interior as a metal cathode in which a metal anode is disposed, another metallic medium electrically coupled to the anode, and another dielectric medium insulating the anode medium from the cathode medium. In each cavity, the cathode is shaped, dimensioned and spaced from the anode so that standing waves of SPP excitations generated by the input light cause quantum field emission of electrons to be rectified as an electrical output. The SPP resonator cavities may be formed in a plurality of diametral sizes corresponding to component light wavelengths to allow full spectrum energy conversion of broadband light input. High energy conversion efficiencies up to a theoretical maximum of 84% can be obtained.

18 Claims, 19 Drawing Sheets d = Light's Electric Field Penetration Depth In Metal
a = Diameter of cavity
h1 = Depth of metal above cavity
h2 = Depth of metal below cavity

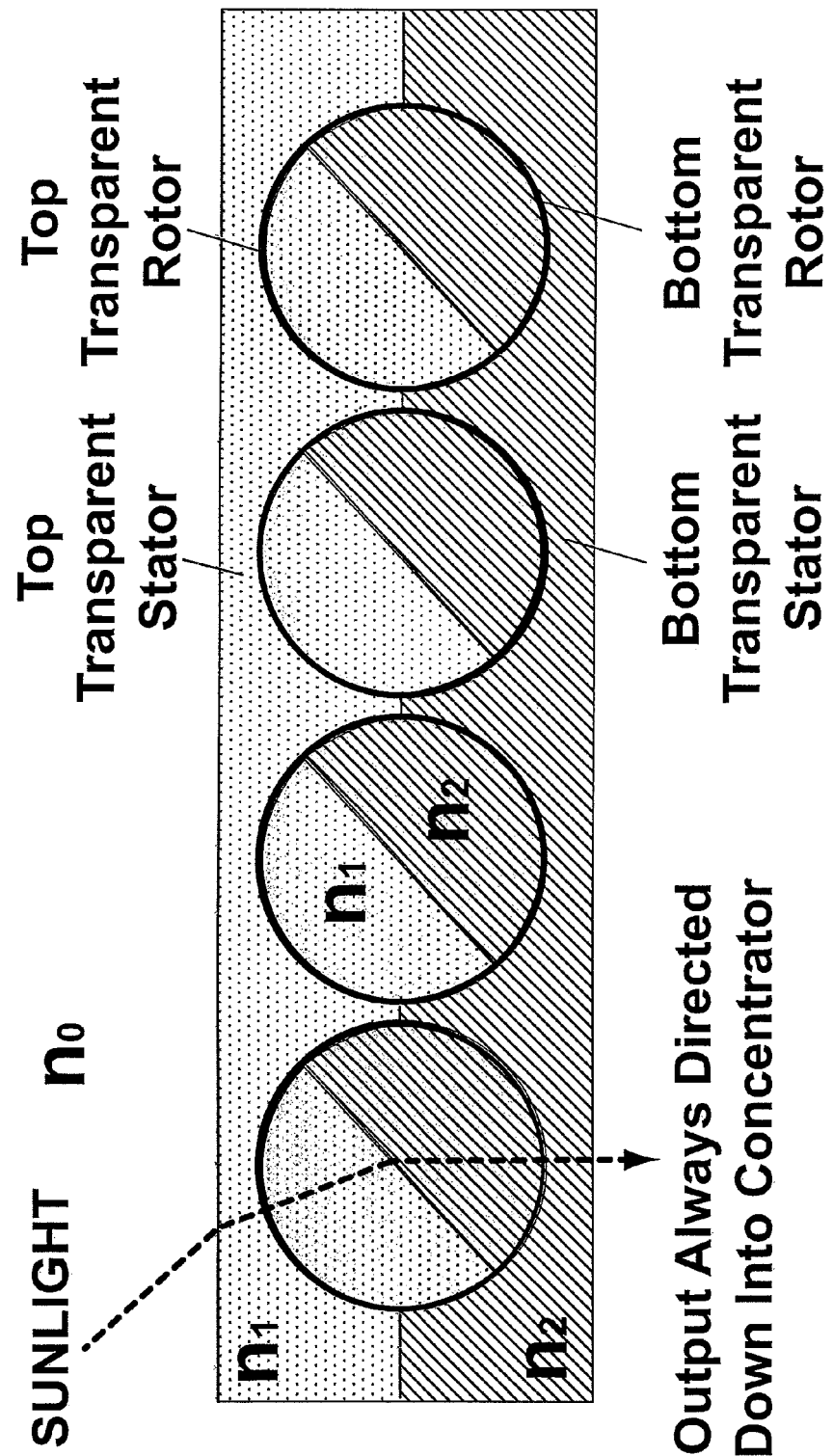

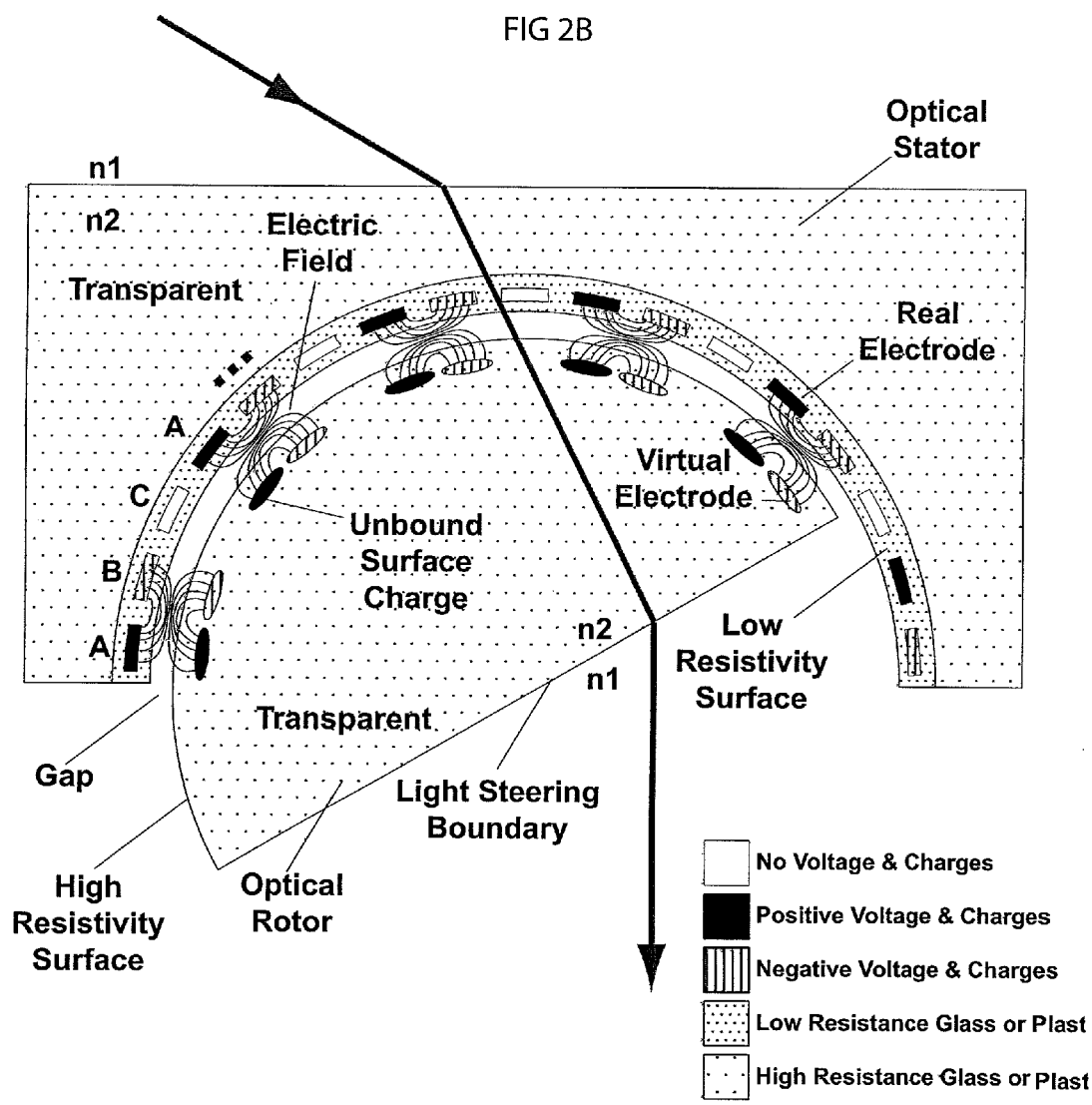

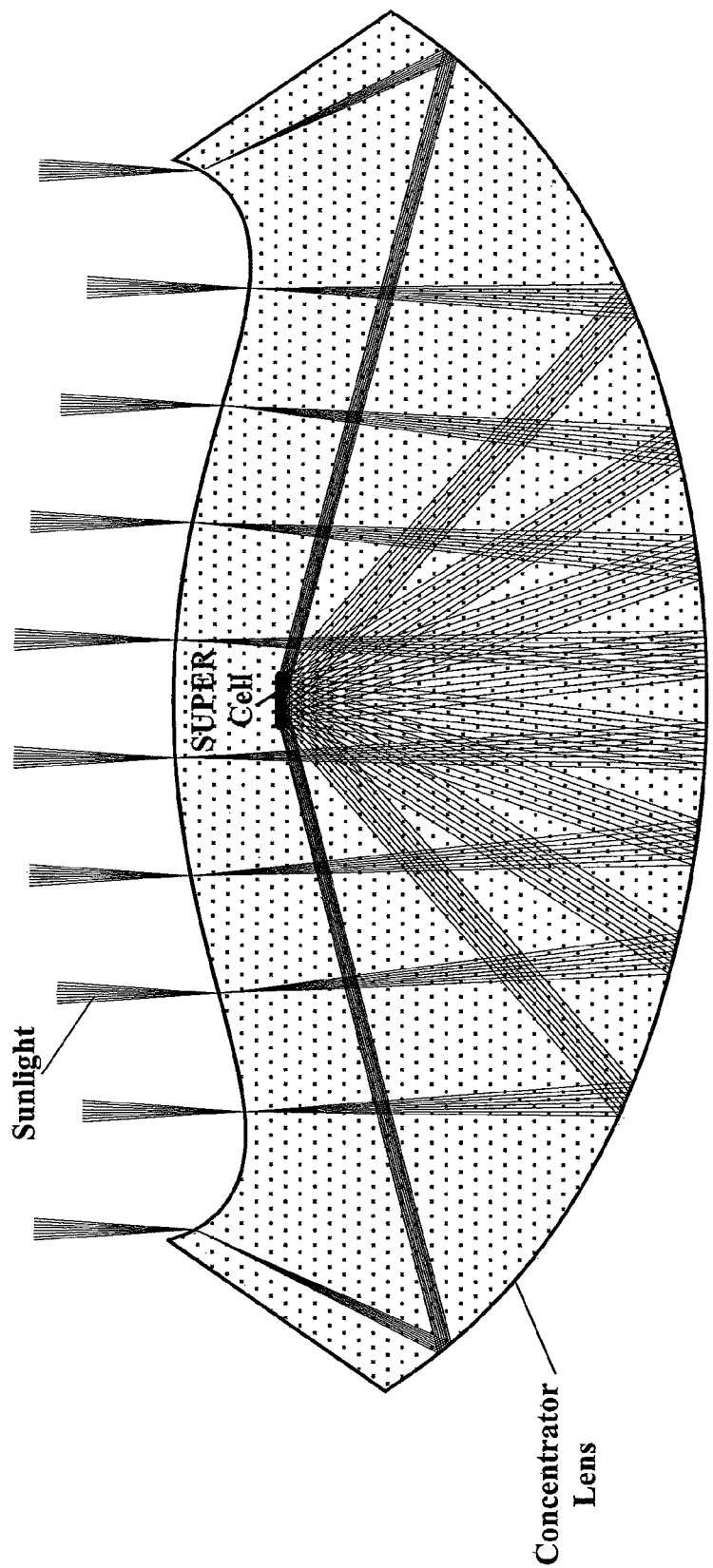

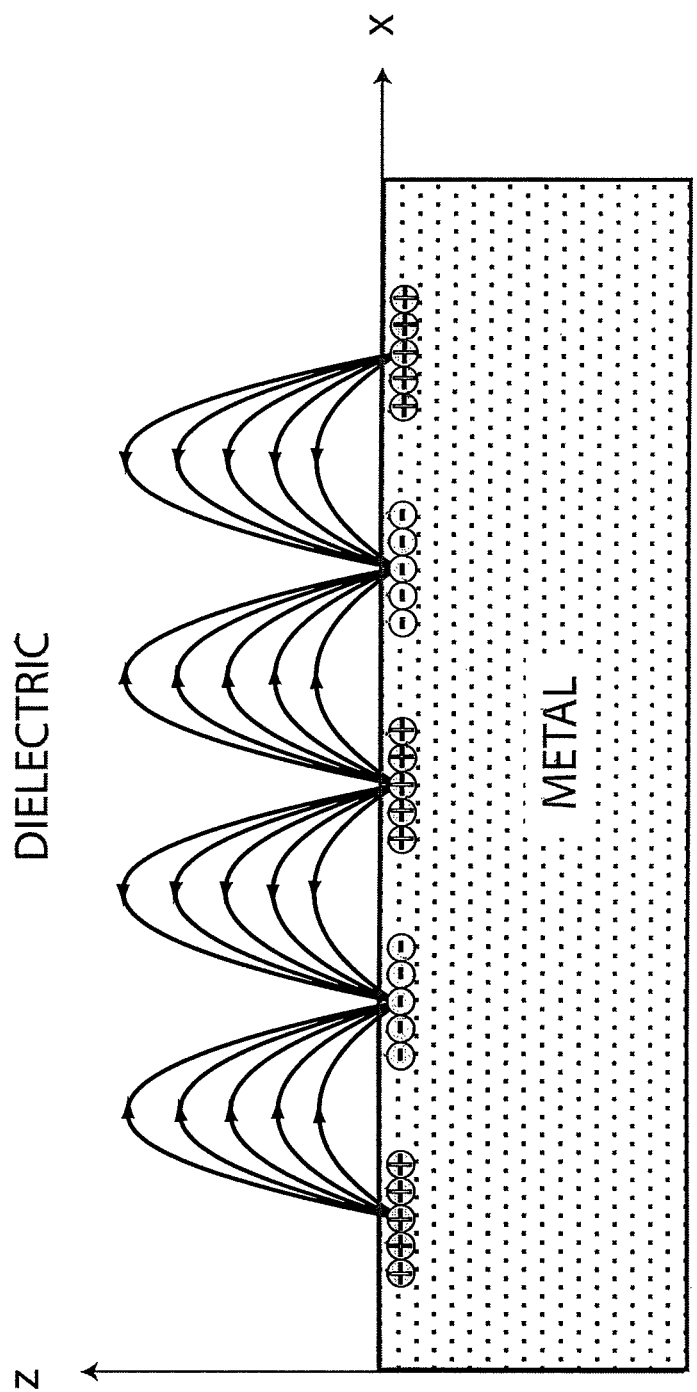

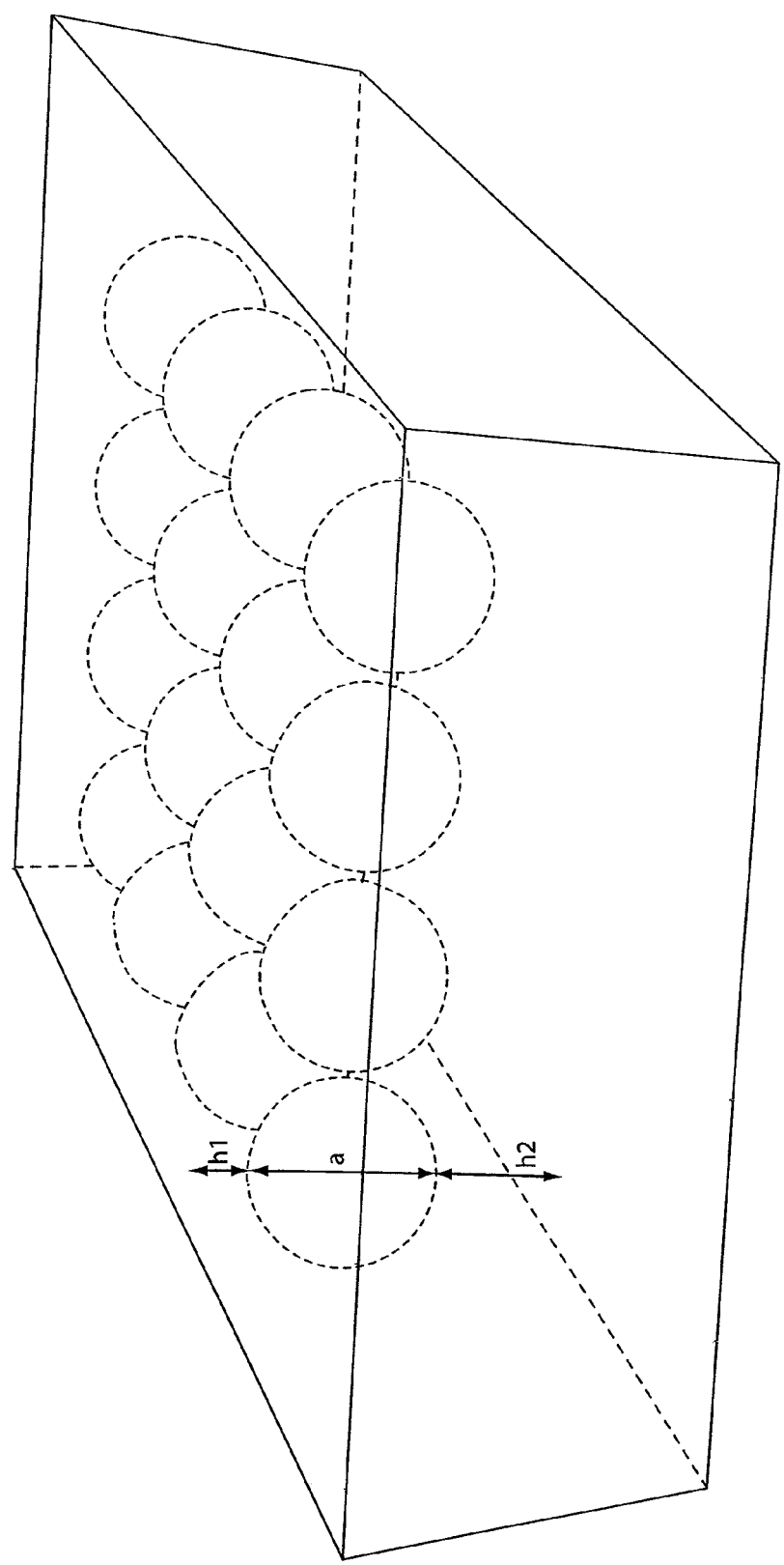

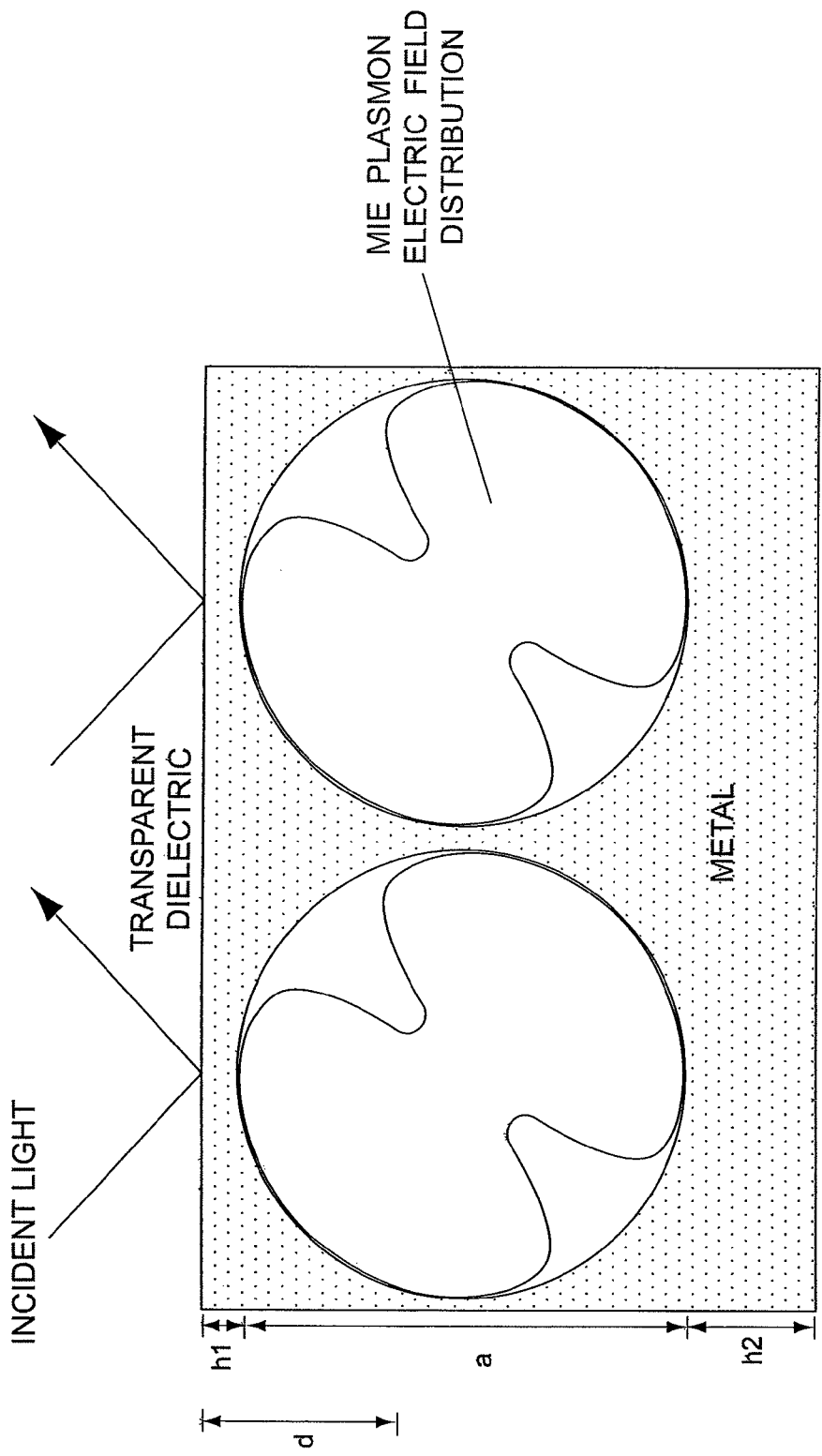

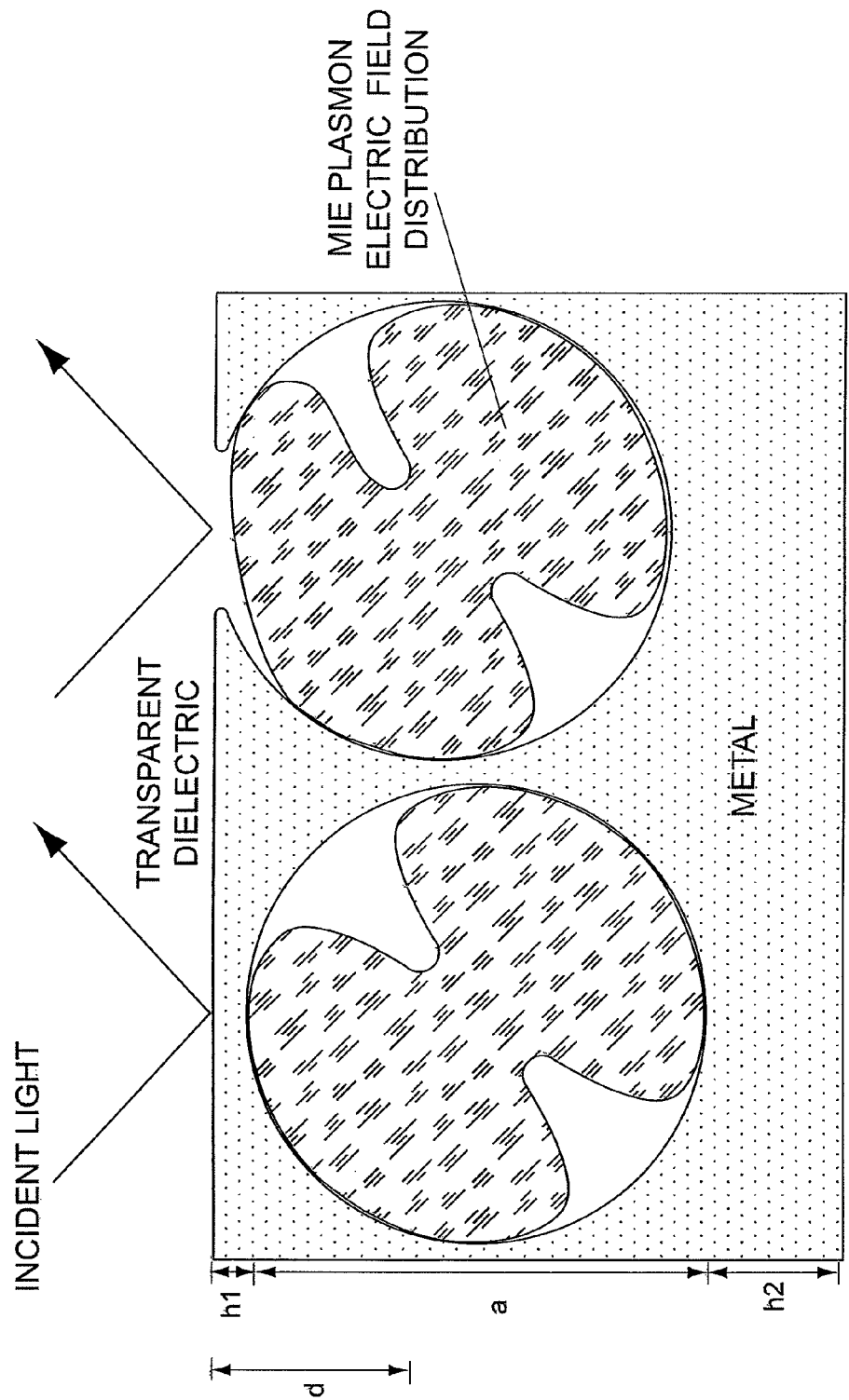

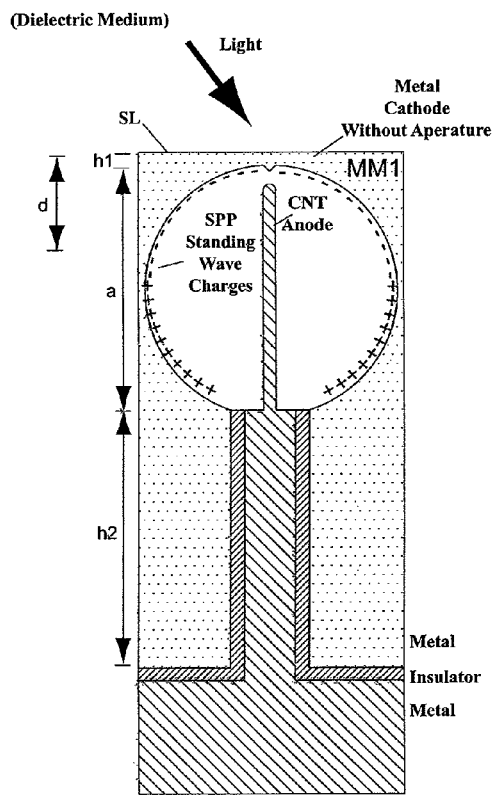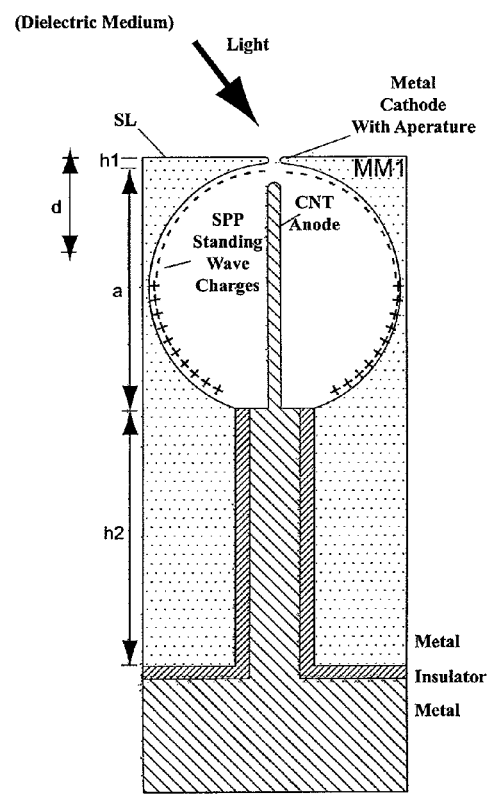
d = Light's Electric Field Penetration Depth In Metal
a = Diameter of cavity
h1 = Depth of metal above cavity
h2 = Depth of metal below cavity
d = Light Electric Field Penetration Depth In Metal
a = Diameter of cavity
h1 = Depth of metal above cavity
h2 = Depth of metal below cavity
FIG 10A
FIG 10B

US 8,866,000 B2

ULTRA-EFFICIENT ENERGY CONVERSION DEVICE FOR CONVERTING LIGHT TO ELECTRICITY BY RECTIFYING SURFACE PLASMON POLARITONS

This U.S. patent application claims the priority benefit of U.S. Provisional Applications 61/273,304 filed on Jul. 31, 2009, and 61/308,542 filed on Feb. 26, 2010.

TECHNICAL FIELD

The present invention relates to an ultra-efficient energy conversion device for converting input light to electricity by rectifying surface plasmon polaritons generated from input light. In particular application, the device is used for converting concentrated sunlight directly into electricity at high efficiencies.

BACKGROUND OF INVENTION

Sunlight is an abundant, clean, renewable, and free energy resource. Current photovoltaic technologies for converting sunlight into electricity have relatively low efficiencies in the range of 5% to 20%, and at best 40% or so for high-performance triple junction PV cells. Other recent attempts include conversion of sunlight into electricity by coupling resonant dipole-like antenna structures at the nano-scale to fast acting diodes for rectifying sunlight-induced electrical fields into electricity (referred to as "rectenna systems"). However, such efforts to develop rectenna systems have fallen significantly short of the desired result, with observed conversion efficiencies around 1% at best. See, B. Berland, Photovoltaic Technologies Beyond the Horizon: Optical Rectenna Solar Cell", NREL Contract No. DE-AC36-99-GO10337, NREL/SR-520-33363, September 2002.

The principle limitation discovered by rectenna investigators was the poor construction of a metal-insulating-metal (MIM) rectifying diode. The diode needed to have an asymmetric current-voltage characteristic, but this was found to be very difficult to achieve in practice. This severely limited the ability of the diodes to perform rectification of the electrical fields of light presented to it from the antenna. Furthermore, a low diode capacitance and properly designed resistance and inductance were needed for optimal impedance matching of the antenna structure to the diode. The added complications of quantum effects severely hampered the development of nano-scale resonant antennas. Quality impedance matching requires control of the shape of the antenna to within $\frac{1}{100}$ of the characteristic size of the antenna—a feat hard to achieve for visible wavelength scale antennas. These prior efforts depended more on extending hybrid microwave methods and techniques, rather than more suitable quantum mechanical methods and techniques.

SUMMARY OF INVENTION

In accordance with the present invention, an energy conversion device for converting light into electricity comprises:

(a) a first dielectric medium for enabling input light propagation therein, (b) a first metallic medium in physical contact with said first dielectric medium, (c) a dielectric-metal interface common to said first dielectric medium and said first metallic medium, (d) an array of surface-plasmon-polariton (SPP) resonator cavities formed at a nano-scale and distributed in said first metallic medium below said dielectric-metal interface, (e) each resonator cavity having a hollow interior so as to form a metal cathode in said first metallic medium, and a metal anode disposed within the hollow interior which is electrically isolated from said metal cathode and said first metallic medium, (f) a second metallic medium coupled in electrical contact with the anodes of said SPP resonator cavities, and (g) a second dielectric medium forming electrical insulation between said first metallic medium and said second metallic medium, wherein each said cathode is spaced by a nano-scale gap from its respective anode such that input light propagating in said first dielectric medium is converted into standing waves of SPP excitations within said SPP resonator cavities below said dielectric-metal interface, and wherein said SPP resonator cavities are configured to enhance electric field interactions of standing waves of SPP excitations within said SPP resonator cavities to exceed a threshold needed for quantum field emission so that electrons are driven out by the electric field component of standing waves of SPP excitations into ballistic electrons that escape from said cathode and pass across said nano-scale gap to said anode which is coupled by said second metallic medium to an electrical output circuit. The term "Surface Plasmon Polariton" is often shortened in the scientific literature to Surface Plasmon when the context is clear. In this document we shall be referring to "Surface Plasmon Polariton" when the term "Surface Plasmon" Is used.

The energy conversion device of the present invention obtains direct conversion of light to electricity by forming a "SUrface Plasmon Enhanced Rectification" cell (referred to herein by acronym as a "SUPER cell") containing the array of nano-scale SPP resonator cavities. In preferred embodiments, the cathode and/or anode of each SPP resonator cavity is formed as a carbon nano-tube. The interior hollow body of the resonator cavity may have a spherical or a non-spherical, curved shape. In each cavity, the cathode is shaped, dimensioned and spaced from the anode so that standing waves of SPP excitations generated by the input light cause quantum field emission of electrons to be rectified as an electrical output. The SPP resonator cavities may be formed in a plurality of diametral sizes corresponding to component light wavelengths to allow full spectrum energy conversion of broadband light input.

For direct conversion of sunlight to electricity, sunlight may be redirected by a sun tracking system along an input light propagation path, and concentrated by an optical concentrator. A preferred form of sun tracking device has X and Y-axis arrays of high-performance non-imaging rotatable lenses with steering mechanisms using patterned arrays of transparent, thin-film transistors (TTFTs). A preferred form of optical concentrator has a concentrator lens configured with shaped radial facets which redirect incoming sunlight by total internal reflection and focus it down to a focal target of $\frac{1}{10000}$th the collection area onto a small-form SUPER cell. The sun tracker and optical concentrator can obtain a concentration factor in the range of 1,000-10,000 suns on a SUPER cell surface area in the range of 1 mm$^2$. High energy conversion efficiencies up to a theoretical maximum of 84% can be obtained.

In other preferred embodiments, the first metallic medium of the SUPER cell may be comprised of alternating regions of noble metals (such as silver) and ferromagnetic materials (such as cobalt) to reduce scattering losses by means of non-reciprocal scattering—similar in principle to a microwave circulator. Metallic tuning stubs may be provided above the dielectric-metal interface to change the effective capacitance and inductance of the SPP resonator cavity to allow multipole tuning. More than one layer of SPP resonator cavities may be employed.

Other refinements include forming the dielectric-metal interface to be roughened or patterned to allow better capture of the input light. The surface of the first metallic medium at the dielectric-metal interface may be formed with an array of apertures or voids positioned over the SPP resonator cavities so that the cavities are not totally enclosed. The energy conversion device can employ one or more gate electrodes biased with a bias voltage to control the flow of electrons from the cathode to the anode. The SPP resonator cavities may contain multiple anodes and component cathodes. The energy conversion device may also employ a static magnetic field to control SPP loss scattering.

Other preferred embodiments, features, and advantages of the present invention will be explained in the following detailed description, having reference to the appended drawings.

BRIEF DESCRIPTION OF DRAWINGS

FIGS. 2A, 2B, and 2C illustrate an example of a sun tracking array for redirecting sunlight along a light propagation direction to an optical focusing device.

FIG. 3 shows an example of a solar concentrator lens for focusing input sunlight on a focal target of a surface-plasmon-polariton enhanced rectification cell.

FIG. 4 illustrates a surface plasmon polariton (SPP) standing wave traveling along the interface of a planar metal layer and a planar dielectric layer.

FIGS. 6A and 6B illustrate different surface patterning alternatives with a layer of spherical voids to induce SPP standing wave states.

FIGS. 7A and 7B illustrate light scattered into SPP states using two alternative 3-dimensional patterned surfaces of spherical voids in a metal layer structure.

FIGS. 10A and 10B illustrate two different alternative embodiments for a spherical void formed in a metallic medium creating a resonant cavity of a metal cathode with a hollow interior in which an anode is positioned for surface-plasmon-polariton enhanced rectification.

DETAILED DESCRIPTION OF INVENTION

In the following detailed description of the invention, certain preferred embodiments are illustrated providing certain specific details of their implementation. In particular, an energy conversion device for converting light to electricity by rectifying surface plasmon polaritons is described in an application for converting sunlight to electricity at high concentration ratios and high conversion efficiencies. However, it will be recognized by one skilled in the art that many other variations and modifications may be made given the disclosed principles of the invention.

Figure 1:
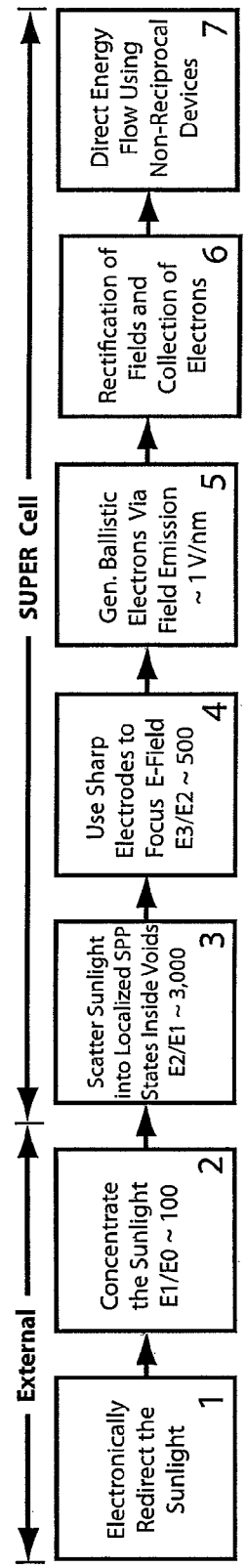
FIG. 1 illustrates a basic process flow for ultra-efficient conversion of sunlight to electricity in the present invention.

Referring to FIG. 1, a basic process flow for an ultra-efficient energy conversion device is illustrated in a block diagram. Steps 1-2 are external steps in the described application for concentrating sunlight as input light to the energy conversion device, while Steps 3-7 are steps for converting input light to electricity in the device formed as a surface-plasmon-polariton enhanced rectification cell (herein named "SUPER cell"). In Step 1, incoming sunlight is electronically redirected by a sun tracking system along an input light propagation path. In Step 2, the input sunlight is concentrated by an optical concentrator at a concentration factor for the light's intensity (in units of watts per square meter) of about 100 times or more. In Step 3, the concentrated sunlight is scattered by a patterned surface of the SUPER cell into localized surface plasmon polariton (SPP) states inside an array of resonator cavities or spherical voids formed with cathodes generating electric field intensity enhancements of about 3,000 times or more. In Step 4, the SUPER cell focuses the electric fields on sharp anode electrodes at an electric field gain ratio of about 1,000 times or more. In Step 5, ballistic electrons are generated via field emissions at a threshold electric field intensity of about 1 volt per nanometer. The ballistic electrons quantum mechanically tunnel into a direct electric current every optical half-cycle, due to an oscillating voltage barrier between the anodes and cathodes of the resonant cavities of the SUPER cell. In Step 6, the ballistic electrons driven out by highly intense standing waves of SPP excitations are rectified and collected by the anodes. In Step 7, the electrical energy flow is directed to an output using non-reciprocal devices. Each of these steps is explained in greater detail below.

For Step 1 of the energy conversion process outlined in FIG. 1, a preferred form of sun tracking system for redirecting incoming sunlight at any incident angle along a desired light propagation path is illustrated having X and Y-axis arrays of high-performance non-imaging rotatable lenses with steering mechanisms using patterned arrays of transparent, thin-film transistors (TTFTs). As shown in FIG. 2A, the sun tracking array has top and bottom transparent stators which encapsulate a row of cylindrical rotors formed with top and bottom transparent halves, which are arranged in parallel. The top and bottom stators and rotors have matched refractive indexes, n1 and n2, respectively, which are designed to refract incident incoming sunlight in a downward direction to a concentrator. Sunlight incident on a top optical stator passes into a top rotor half of the same refractive index, and is refracted as it crosses the boundary with the bottom rotor half. For certain values of the refractive index and inter-rotor spacing having the ratio n1/n2>1, it is possible to avoid all shadowing between optical rotors.

As shown in FIG. 2B, each rotor has a light steering boundary between top and bottom halves with different refractive indexes. The top stator surface has an array of electrodes formed in a pattern of transparent thin film transistors (TTFTs) on a facing side of a gap between it and the rotor. A control pattern of voltages can be applied to the stator electrodes. Voltages applied to the array of TTFTs on the top stator surface induce free charges on the surface of the top rotor half. The top rotor surface is formed of high resistivity material localizing the surface charges induced by the stator electrodes. These migrate relatively slowly in the dielectric material of the rotor and form virtual electrodes on the rotor surface. By changing the pattern of voltages on the TTFT stator array, electrical forces are induced to bring about a precise, controlled, rotation of the rotor to a desired position for optimally redirecting the incoming sunlight at an incident angle across the light steering boundary down to the concentrator.

Figure 2C:
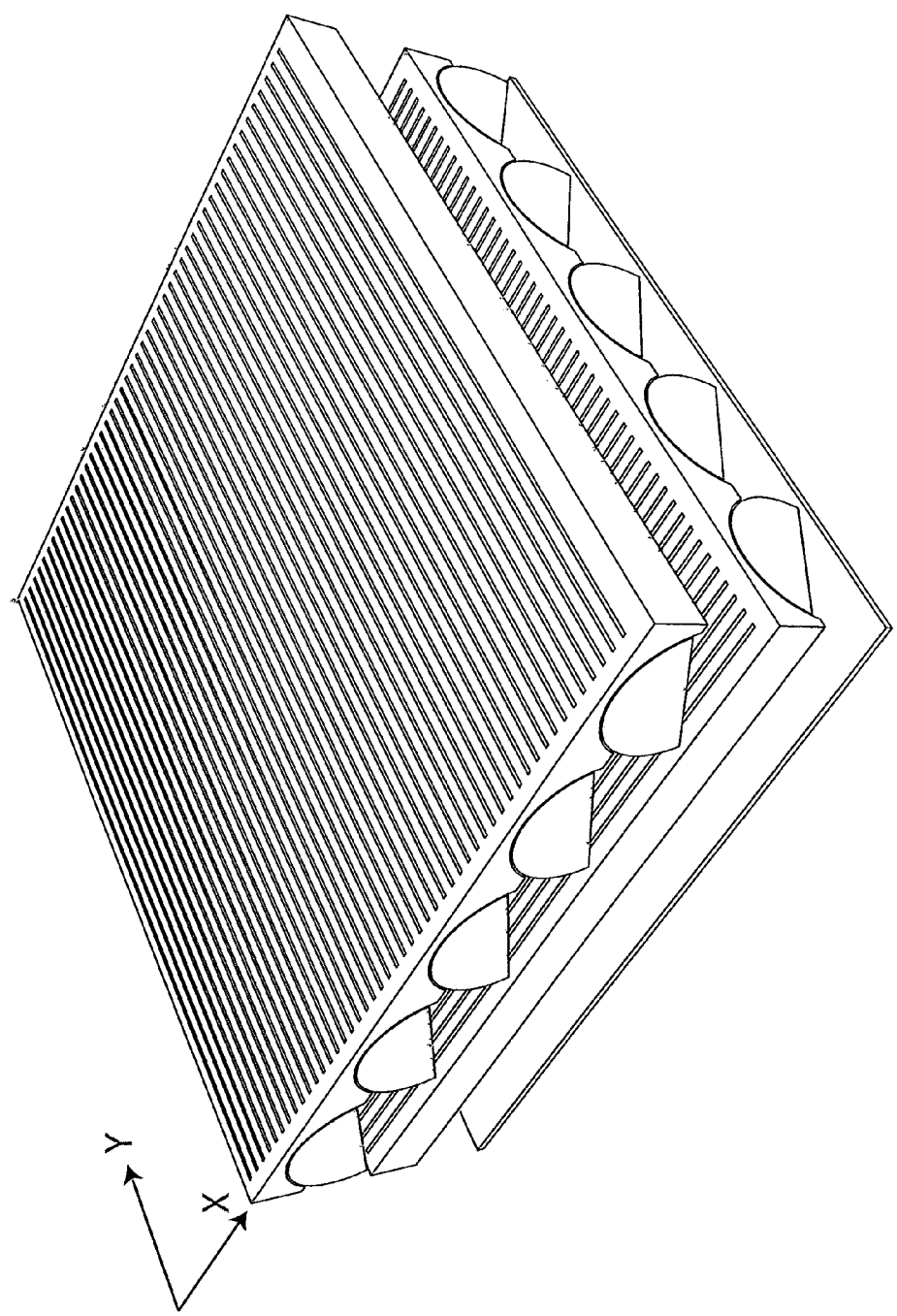

As shown in FIG. 2C, two crossed 1-axis rotor arrays can be combined to achieve a 2-axis sun tracker. Electrostatically-actuated sun trackers can reduce system costs significantly, compared to far more expensive 2-axis mechanical trackers that require large load-bearing structures. The electrostatically-actuated trackers are readily built into the panels and can operate at any panel orientation, making them easier to mount on the tops of buildings or roofs having fixed tilts. A more detailed description of this type of sun tracking array is provided in U.S. patent application Ser. No. 11/700,751, filed on Jan. 30, 2007, by the same inventor, entitled "Solid State Sun Tracker", which is incorporated by reference herein. Other types of sun tracking technology may also be used.

For Step 2, an example of a sunlight concentrator is shown in FIG. 3 having a focal target of 1/10000th the collection area onto a small SUPER cell. In a preferred embodiment, there may be 2,000 micro concentrator lenses per square meter of collector panel and one SUPER cell per micro-lens and the concentrator lens is configured with radial facets which redirect incoming sunlight by total internal reflection. The number of concentrator lenses per panel is determined by finding the value that minimizes the cost per watt given the component costs, manufacturing tolerances, and yields. Concentration of this magnitude dramatically reduces the surface area of nano-structured materials needed to be manufactured for the SUPER cells. It also enables sunlight to be collected over a large solid-angle (by conservation of etendue), thereby improving optical momentum-matching of light into SPP states. It is critical to appreciate that this first stage may be used to substantially increase the electric field-strength of the incident light, this enhancement is needed for significant electron field-emission and power generation from the SUPER cell. For example, if a concentrator increases sunlight intensity by a factor of 10,000, then the average electric field strength of light is enhanced by a factor of the square root or 100. If the micro concentrator lens is kept small, of the order of about 500 mm$^2$ or less, then the total collected energy per lens is thermally manageable, of the order of high brightness LED technology, and most of the energy is being converted to electricity not heat. A more detailed description of this type of sunlight concentrator is provided in U.S. patent application Ser. No. 12/008,053, filed on Jan. 8, 2008, by the same inventor, entitled "Non-Imaging Facet Based Optics", which is incorporated by reference herein. Other types of solar concentrator technology may also be used.

A background explanation for Step 3 of scattering incident light into surface plasmon polariton (SPP) states will now be discussed. Quantum mechanics recognizes that there is fundamental and intrinsic wave-particle duality in nature. A quantum of light is called a photon, a quantum of electricity is called an electron. Resonant antenna structures that are typically physically large allow a photon to scatter into an electron by means of a resonant structure. However, for certain configurations of matter containing energy propagating at the boundary between dielectrics and metals the individuality of photons and electrons can be blurred and a hybrid quasi particle that is part photon and part electron may be envisaged. These are the Surface Plasmon Polaritons. It may be thought of as part electron and part EM field that are bound together in a field density wave. At the nano-scale, the impedance-matched antenna structure may be replaced with a momentum-matched plasmonic structure, which supports these quasi particles. The quasi particles may then be induced to become photons or electrons by adjusting the energy and momentum of particles in its immediate environment. Therefore, no classical resonant antenna structures are needed to extract electrons if one can control the polaritons.

Plasmonic circuits are almost completely confined to a metal-dielectric interface so that fabrication is easier because it is confined more closely to just two dimensions. The scale of plasmonic circuits may be significantly smaller than the wavelength of light, and surface plasmons are a direct bridge from photonics to electronics because a surface plasmon polariton (SPP), or simply a surface plasmon, may be thought of as a quantized hybrid of partly electron and partly photon. The hybrid nature of SPPs provides a means to convert free-space photons into confined electrons in a circuit by electronic techniques. In a preferred embodiment, photon-generated electrons are electronically controlled by exploiting Vacuum Nano Electronics (VNE) and engineered nano-structured materials to create the equivalent of vacuum diodes. Such diodes work with only one carrier type, electrons (and not holes), and allow rectification of SPPs into a DC electric signal, which may then be stored or utilized as source of electrical energy.

Step 3 involves efficiently creating SPP states at the interface of the SUPER cell target of the concentrator optics. The interface may be formed as a thin layer of metal deposited on a dielectric layer. FIG. 4 illustrates the induced SPP states on a planar boundary between a dielectric and a metal. A traveling density wave of electrons moving at the metal-dielectric interface is shown. The excitations in FIG. 4 are compression waves of electrons that move in the direction of the input photon momentum projected onto the metal-dielectric interface. The electric fields that result from this electron disturbance are normal to the interface and penetrate into the dielectric by about the dielectric wavelength and also penetrate into the metal by its skin depth. For planar systems like this it is critical to realize that only Transverse Magnetic (TM) polarizations are allowed by the laws of electromagnetism. For blackbody radiation, like that of sunlight, this means that only half of the incident energy even has a chance to become an SPP excitation because blackbody radiation has 50% TM and 50% Transverse Electric (TE) polarization. As will be discussed shortly, this severe limit is overcome in this invention. Also for planar systems boundaries, as show in FIG. 4, the traveling wave nature of the excitation is not as effective in enhancing the electric field intensity as a localized standing wave. This problem is also overcome in this invention.

Figure 5:
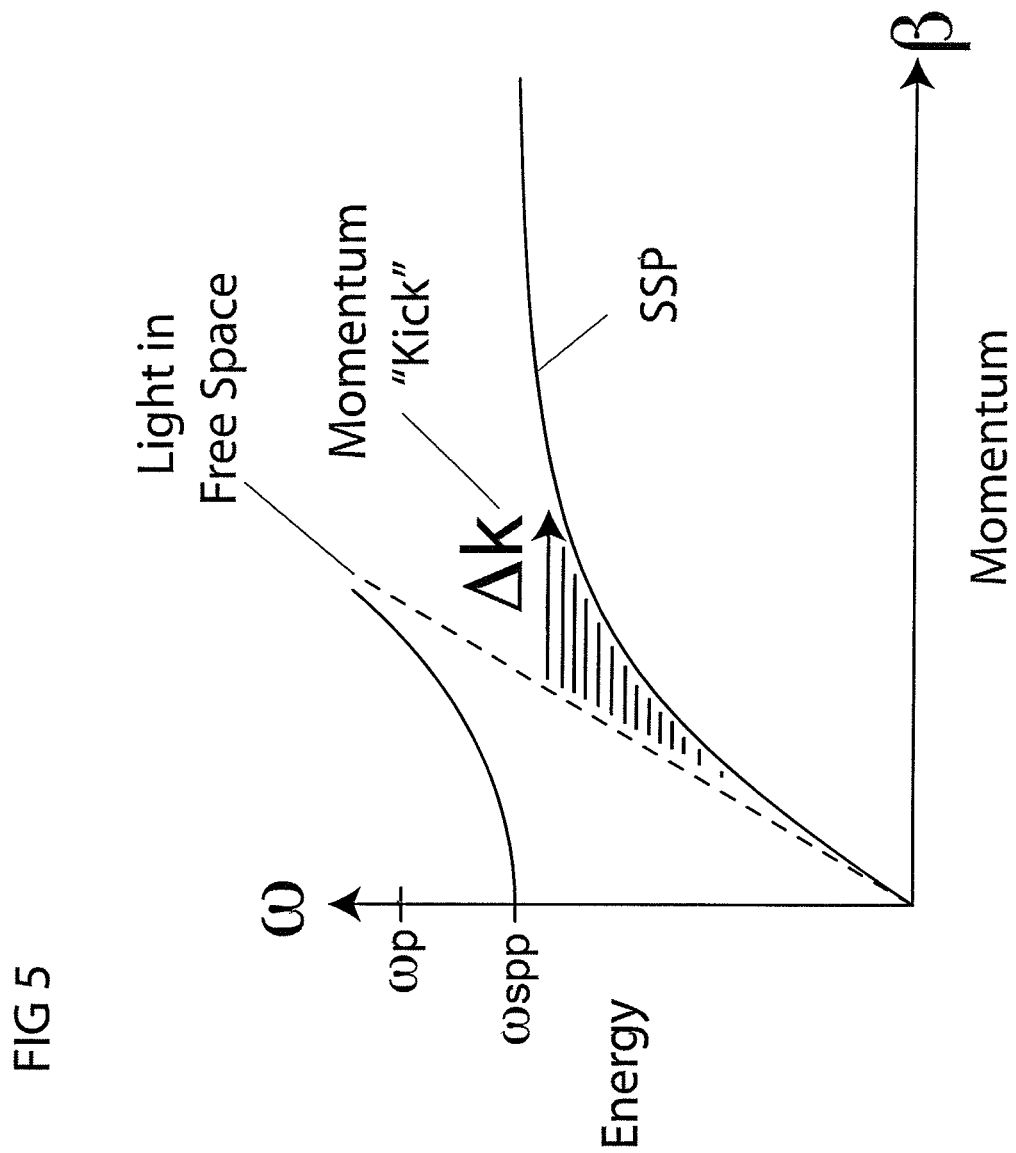
FIG. 5 illustrates a typical dispersion relation for planar metal-dielectric boundaries showing how a momentum kick is needed for boosting a free-space photon having Transverse Magnetic (TM) polarization into a traveling wave SPP.

Moreover, only certain energies of light incident from unique angles are coupled into the SPP modes of planar geometries, like that of FIG. 4, due to momentum matching conditions between free-space light and SPP modes. Specifically, a momentum kick in the plane of the metal-dielectric interface is required to convert a photon into a SPP. FIG. 5 illustrates the required momentum kick (proportional to $\Delta k$) needed for moving a free-space photon into an SPP state. It is possible to provide this momentum kick to the incident photons by adjusting the incident angle of the light in the concentrator medium with refractive index greater than 1, by using a patterned surface, or a combination of these two techniques. Symmetry considerations also play a factor in matching the momentum states of photons to SPP.

The thin metal layer that supports SPP modes can be provided either with or without a pattern of perturbations (typically holes) on its surface. When there is an array of holes on the surface then the well known Bloch modes are induced and there is a corresponding momentum kick proportional to the magnitude of the reciprocal lattice vector. A randomized surface having a 3-dimensional structure of holes has many reciprocal lattice vectors because it is composed of many spatial Fourier components. This would result in a broader momentum-matching that depends on the specific statistics of the random surface morphology. In the case where there are no holes on the metal surface, but cavities are just beneath the surface, then momentum matching is also achieved by exciting Mie cavity modes. It is important in this invention that these cavity modes, especially from spherical cavities, allow an approximately angle-independent and polarization-independent means of exciting SPPs. If a buried cavity is close to the surface it will eventually create a hole to the outside dielectric and direct Bloch mode momentum kicks induce the matching. Bloch mode matching is associated with traveling waves and Mie mode matching is associated with localized standing waves.

Figure 6B:
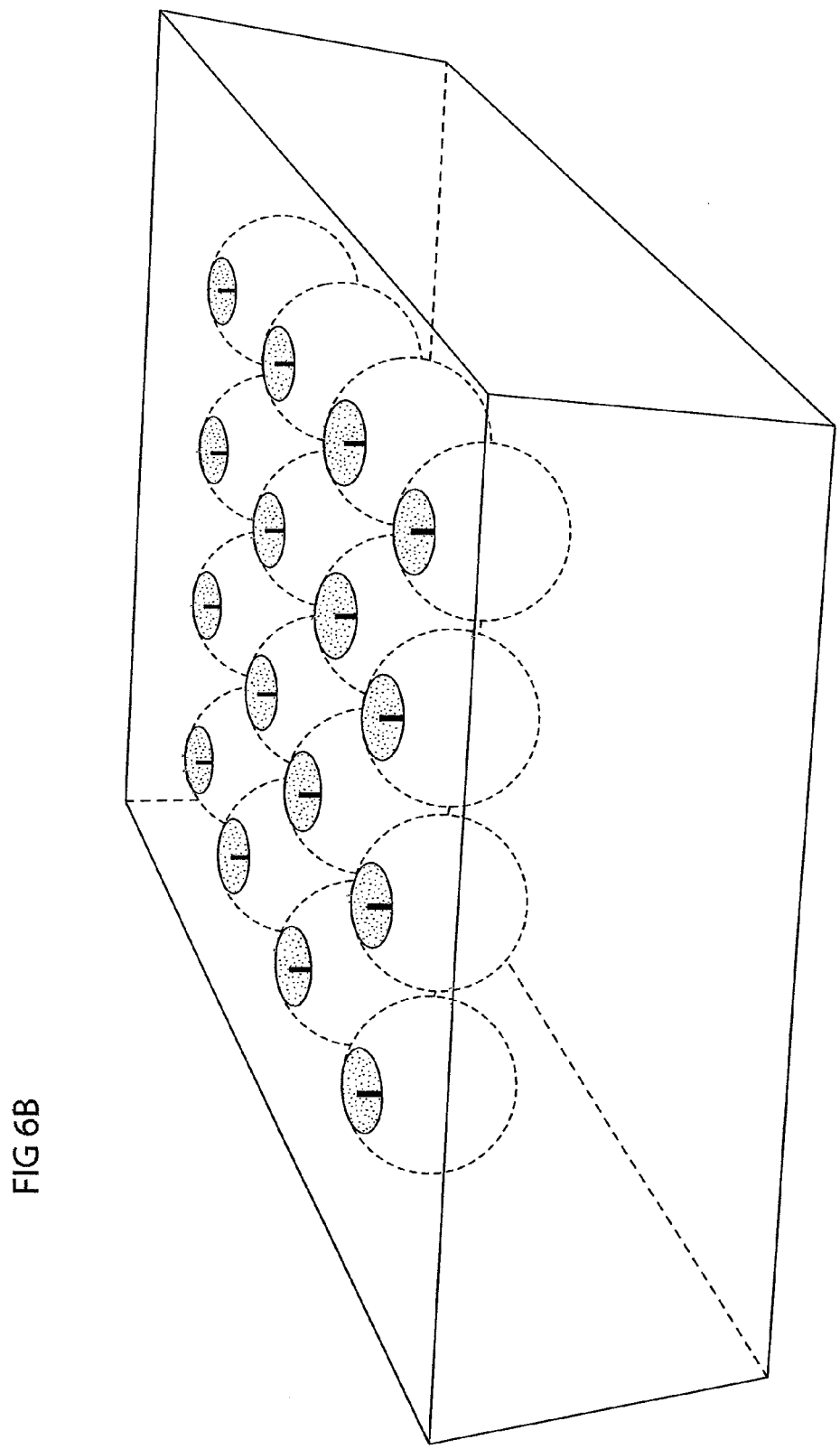

FIG. 6A illustrates an example without surface patterning using an array of buried cavities to induce localized SPP states within the cavities. FIG. 6B illustrates an example of surface patterning with small holes to induce SPP states that also include more pronounced traveling waves on the surface of the metal. Both variations on the same theme are useful for converting solar energy into electricity and have distinct advantages and disadvantages from the point of view of performance and manufacturability.

FIG. 7A illustrates the consequences of using a 3-dimensional patterned surface of small cavities to induce localized SPP states. The plasmon fields inside the cavities are found to obey Mie scattering theory, and if the cavity has only a very thin layer $h_1$ of metal above it, which is less than the metal's electric field penetration depth (also called the skin depth) d, and $h_1$ is on the order of 1 nm to 50 nm, then evanescent coupling from the outside into the void's localized SPP mode becomes possible. If the sizes of the voids and top cover thickness $h_1$ are not uniform and are chosen to correspond to an optimized spatial distribution, then the full range of sunlight, from about 1 ev-3 ev, could be absorbed by SPP excitations the different voids for different parts of the solar spectrum, although some additional reflection losses from the top of the voids may be induced. In the preferred embodiment $h_1 \ll d \ll h_2$, where $h_1$ is the thickness of the thin layer of metal above the cavity voids, d is the metal penetration depth and $h_2$ is the thickness of metal below the cavity void. The total thickness of the metal layer is $h_1+h_2+a$, where a is the cavity diameter. Typically we consider the preferred embodiment to occur when the following ratios are used: $d/h_1 > 10$ and $h_2/a > 10$. It is important that $h_2$ is much larger than $h_1$. The preferred embodiment is that the ratio $h_2/h_1 > 50$. Failure to keep $h_2 \gg h_1$ will cause a loss of up to 50% of the incident light energy due to scattering back into the surrounding dielectric.

FIG. 7B shows variation of the cavity geometry where the metal above the cavity has a hole to the dielectric. This geometry provides an additional means for tuning the bandwidth of each cavity and for alternate cathode geometry while not greatly impacting the Mie modes. Optimum use of this variation requires that Bloch modes are considered by properly choosing the array geometry.

Figure 8:
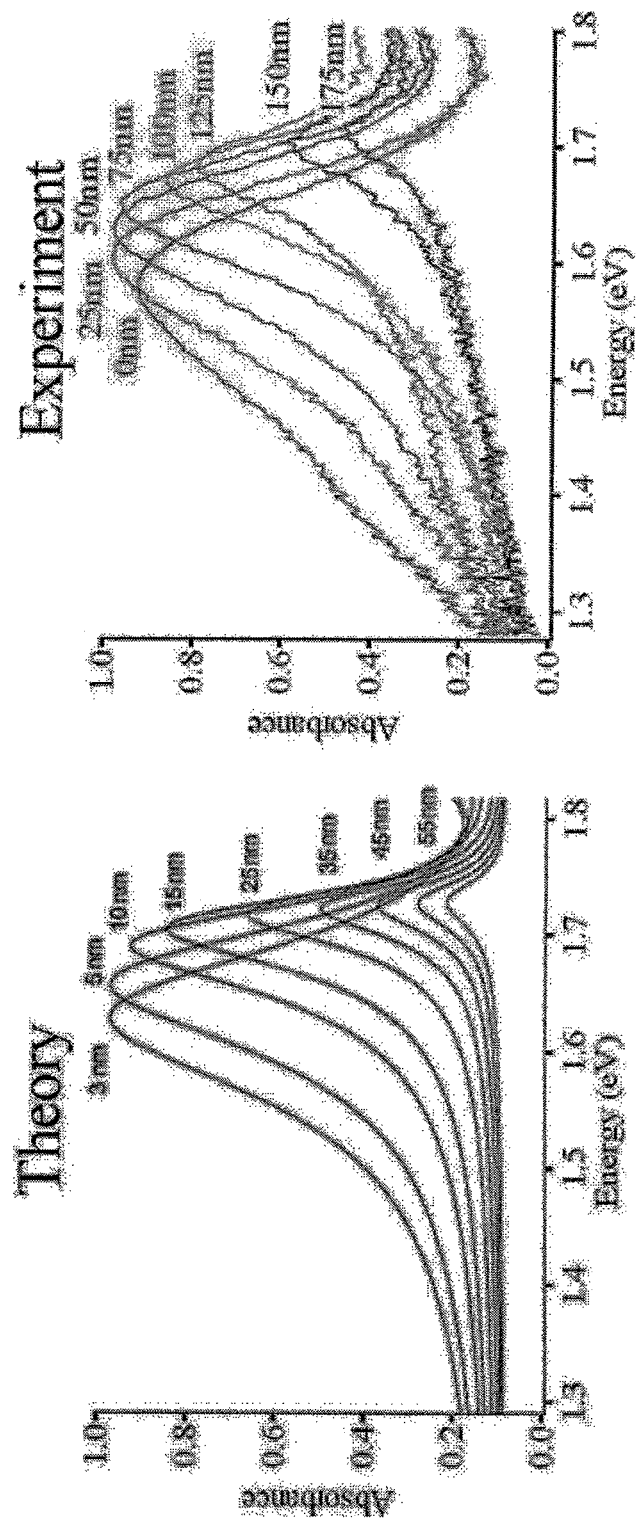
FIG. 8 compares light absorption into localized SPP states in spherical voids in theory and in experiment for a range of thickness of the metal layer.

FIG. 8 illustrates the light absorption into localized SPP states in small arrays of close packed spherical cavities in theory compared to results in experiment for a range of thickness $h_1$ of the metal layer above the voids from 0 to 175 nm—as detailed by T. Kelf, "Light Matter Interactions on Nano-Structured Metallic Films", Ph.D. Thesis, U. of South Hampton 2006. Near perfect light absorption is obtained in the range up to about 100 nm. Essentially 100% of light incident on a thin layer having a 3-dimensional periodic array of metallic nano-structured voids is absorbed when the input light is at the plasmon resonance of the void. The exact energy of the input photon that is optimally matched for absorption is thus a function of easily engineered parameters, i.e., the void size, shape, surrounding material and internal non-metallic material (or vacuum). The inter-void spacing and the void depth are chosen to be much less than the metal's penetration depth. Additionally, the buried spherical cavities, as shown in FIG. 7A, provide a geometry that is insensitive to the incident angle of light, unlike purely planar metal-dielectric boundaries of FIG. 4. Moreover, the cavity is insensitive to the polarization (TM or TE) of the input light. This is a significant and unobvious improvement over a surface only having a simple planar surface when applied to solar cells, see Tadashi Takemori, et. al. "Field Enhancement in a Spherical Cavity Beneath a Metal Surface", Journal of the Physical Society of Japan, Vol. 57, No. 9, September 1988, pp 3188-3197.

Figure 9:
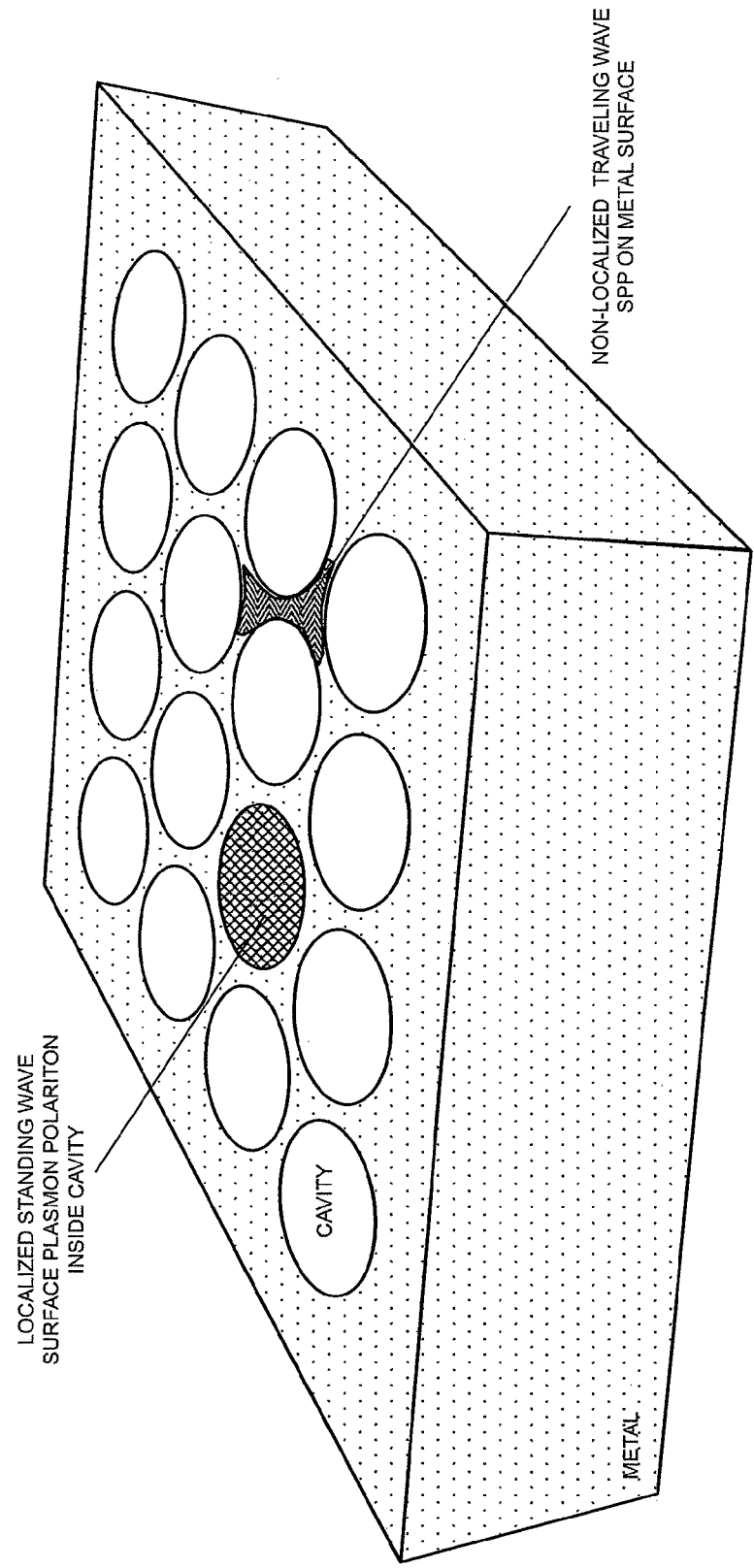
FIG. 9 illustrates the localized and travelling SPP states inside the cavity and on the surface of the metal layer supporting SPP excitations.

FIG. 9 illustrates the localization of SPP states inside the patterned surface in Step 3 of the energy conversion process. The SPP excitations are shown as surface plasmons of traveling charge oscillations coupled to photons having a traveling velocity, and as localized plasmons of localized charge oscillations. When tightly confined, the localized SPP excitations exhibit a large electric field strength that is many orders of magnitude above the incident light in the dielectric. Furthermore, because the incident light has already been concentrated by optical means, the electric field strength is many orders of magnitude above that provided by the intrinsic solar flux, so that when combined with the extreme electric field strengths characteristic in localized SSP (standing wave) modes, a compounded effect is produced. These high fields can thus be used for modulating the tunneling probability of electrons and providing a means for electrical rectification of the incident light. Other types of 3-dimensional surface patterning may also be used, such as cylinders, gratings, randomized structures, etc. The nano-patterning of the thin metal layer may be obtained by using either e-beam, evaporation techniques similar to that used in Spindt emitter fabrication or nano-assembly techniques.

For Step 4 of the energy conversion process, an array of resonant cavities is provided in the metallic layer for focusing the electric field caused by standing wave SPP excitation for electron field emission in a manner similar to vacuum microelectronics applications. FIG. 10A illustrates a preferred structure for a resonant cavity formed in a metallic medium MM1. The surface layer SL of the metallic medium MM1 is in contact with the dielectric medium through which the input concentrated sunlight propagates. The metallic medium MM1 has an array of hollow voids within that forms the resonant cavities and light energy enters the cavity by evanescent electromagnetic coupling. The metal surface around each hollow void acts as a metal cathode. A metal anode is disposed within the hollow void and is electrically isolated from the metal cathode and the metallic medium. A lower metal layer is coupled in electrical contact with the anodes and insulated by an insulator layer from the metallic medium MM1. The anode may be formed as a thin carbon nanotube (CNT) within the hollow void of the cathode. FIG. 10B shows an alternative embodiment with explicit surface patterning (holes into the cavity) that provides a small aperture to the dielectric medium but without significant perturbations of the internal electric fields.

The SPP standing wave excitation is a highly coupled interaction between electrons in the surface of a conductive material, which includes the internal surface of the resonant cavity, and the electromagnetic field in the region above the conductor. If the evanescent electric field at the conductor surface is strong enough, then the electric field component normal to the surface can cause quantum tunneling and allow the electrons to be liberated. Thus, the SPP mode is a self-contained force and source for electron emission. Another equivalent way of thinking about the physics is in terms of scattering of the SPP electrons into ballistic electrons by absorption of one or more photons per electron and tunneling across the cathode-anode gap.

The basic function of the resonant cavities is for absorption of the input light and electric field enhancement. Electric field enhancement is a result of field lines that are that are highly bent or stressed, such as by using sharp-tipped anodes within the cavities and the cavity itself. The resulting structure is very close in geometry to a Spindt field emitter array as are used in vacuum microelectronics applications such as plasma displays. Spindt field emitters can be made with ultra-sharp emitter tips from single wall carbon nano tubes (CNTs). With a relatively large cavity compared to CNT tube volume, the electric field enhancement would be given approximately by $B=3.5+h/r$, where h is the height of the CNT electrode and r is its radius. For a cavity that is 500 nm in diameter and a CNT electrode that is slightly less than 500 nm in height and 1 nm in radius, the electric field enhancement would be about $B=500$. A more complete explanation is provided by M. Wang, et al., "Field-enhancement factor for carbon nanotube array", Journal Of Applied Physics, 014315 (2005).

Figure 11A:
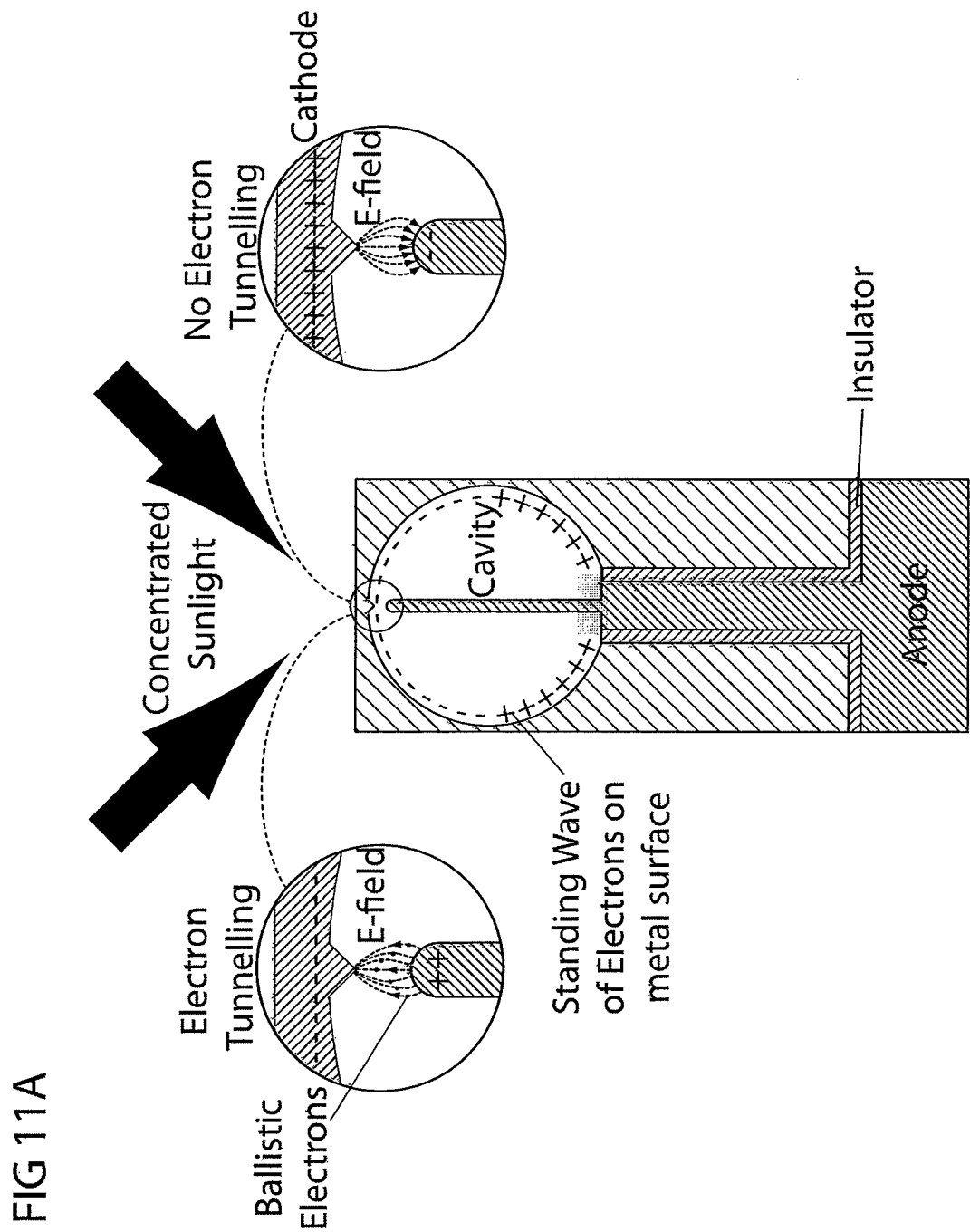
FIG. 11A illustrates the detailed anode and cathode electric field effects of standing wave SPP excitations from cathode to anode of a resonant cavity.

For Step 5, FIG. 11A illustrates the effect of SPP standing wave excitation of electrons from cathode to anode of a resonant cavity. The cavity can have a diameter on the order of the wavelength of light, which would be in a range of diameters of up to about 1,000 nm for the IR part of the spectrum of sunlight. It may have a thin layer of metal over the top of the cavity of the order of about 20 nm in thickness proximate the point of the anode. Depending on the excess charge distribution on the cavity walls, ballistic electrons may be emitted from the cathode to the anode by electron tunnelling (left side of diagram), or non-emitting (right side of diagram), depending on the polarity of standing wave oscillation. The electric field enhancement would therefore be expected to be in a range from 100-1000 times.

It is not necessary to have a CNT anode tip to achieve these field enhancement levels; different sharp electrode geometries and materials may be used depending on performance and fabrication requirements. Different configurations may be used for the anode and cathode, the main requirement being that the chosen structure lets the SPP standing wave form inside of the cavity, while keeping high light absorption and allowing subsequent field emission, and providing an asymmetric field strength between cathode and anode to provide a preferred direction of ballistic electron travel. The sharp anode tip has a reduced dimensionality that is very much asymmetric compared to the curved walls of the cathode cavity. It is important to note that conversely the cathode could be formed to be sharper than the anode so that the fundamental asymmetry is set up that causes flow of electrons in one direction. By using such asymmetric structures the electric fields are also non-uniform and are higher where the electrons to be liberated are located.

Figure 11B:
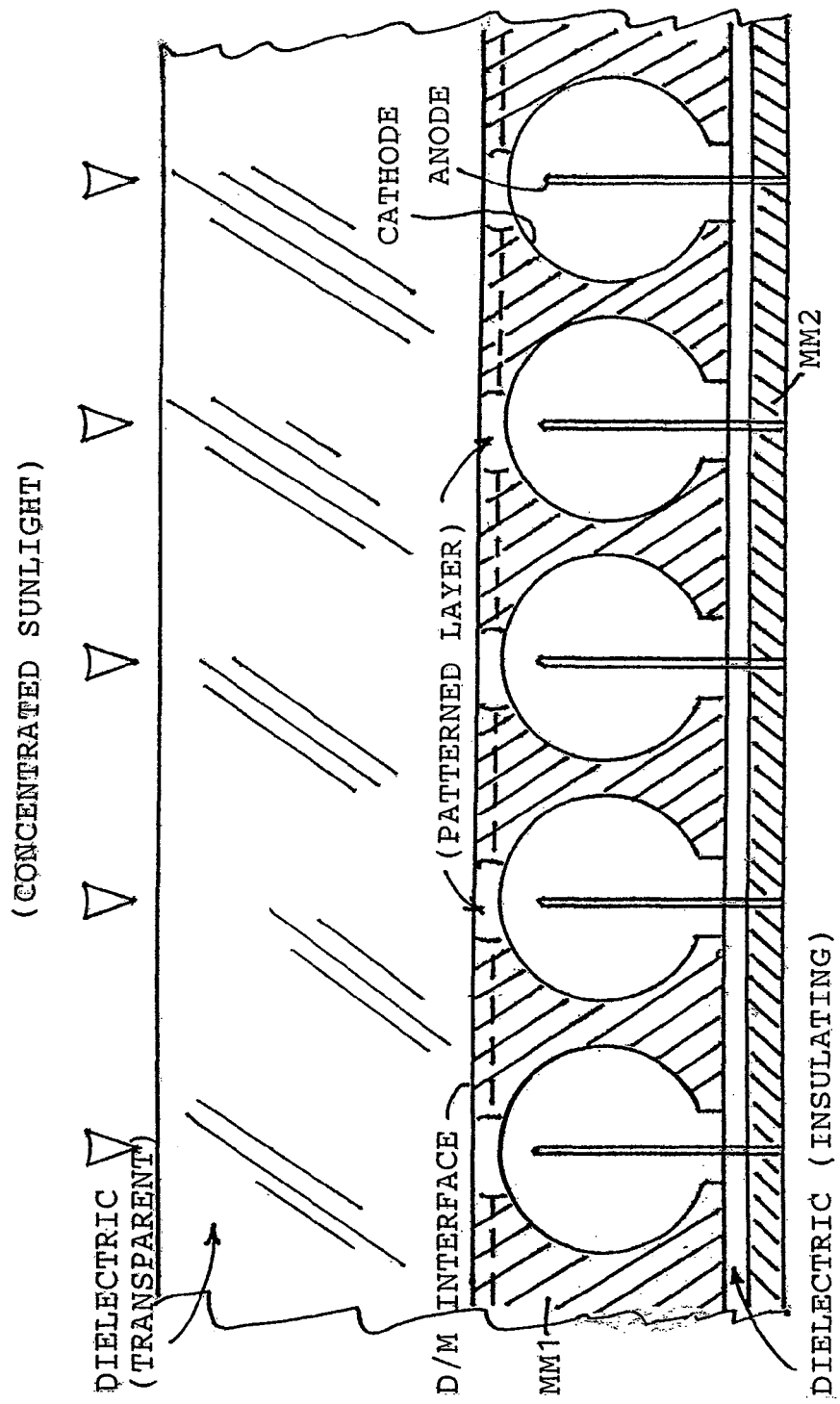
FIG. 11B shows a sectional view of a surface-plasmon-polariton enhanced rectification cell formed with an array of resonant cavities.

FIG. 11B shows a sectional view of a surface-plasmon-polariton enhanced rectification cell formed with an array of resonant cavities. Concentrated sunlight is input to a first dielectric medium having a transparent characteristic for propagating the input light. The first dielectric medium is in contact with the first metallic medium MM1 along a dielectric-metal (D/M) Interface. The first metallic medium MM1 has the thin Patterned Layer at its surface at the D/M Interface for providing a momentum kick in the plane of the dielectric-metal interface to convert photons into SPP states. An array of surface-plasmon-polariton (SPP) resonator cavities is formed within the first metallic medium MM1 at a nano-scale below the D/M interface. The Patterned Layer may be formed with an array of apertures or voids positioned over the SPP resonator cavities so that the cavities are not totally enclosed. Each resonator cavity is formed by a hollow void around which the metal surface acts as cathode, and a metal anode is disposed within the hollow void electrically isolated by a dielectric layer (having an insulating characteristic) from the cathode and first metallic medium MM1. The anodes of the array are coupled in electrical contact with a second metallic medium MM2.

Figure 12:
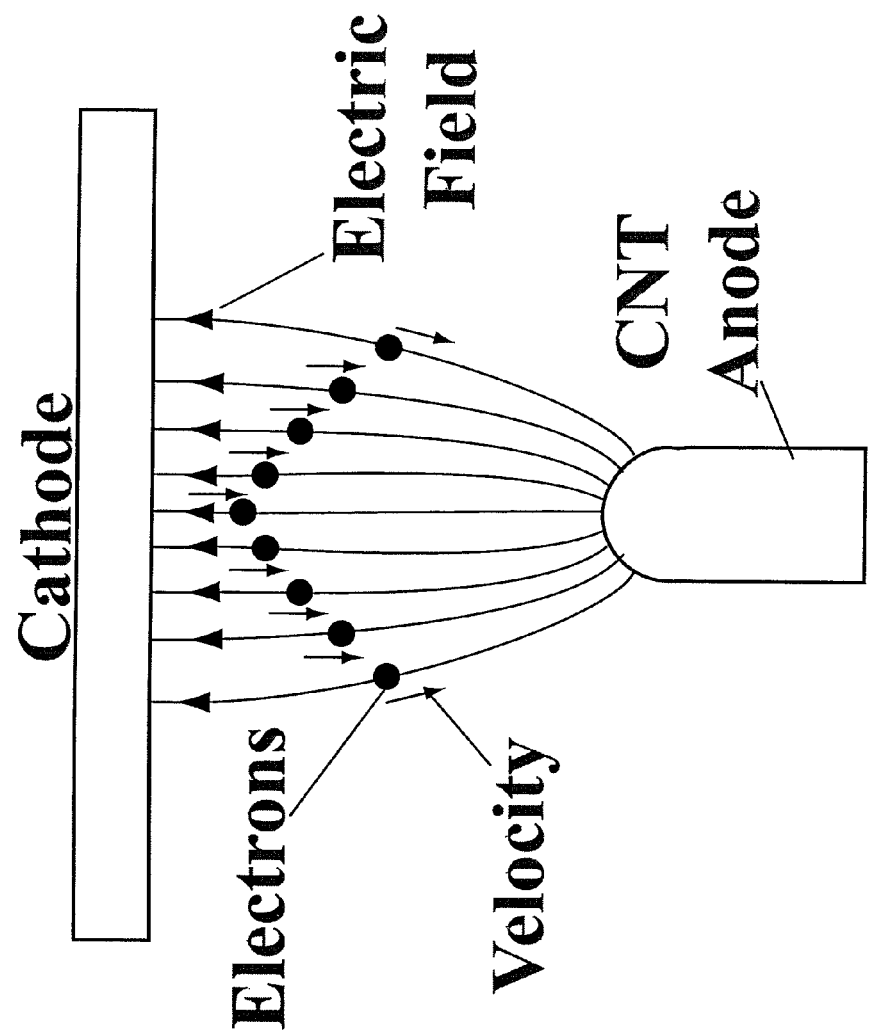
FIG. 12 illustrates a detailed view of a metal cathode generating ballistic electrons toward a carbon nanotube (CNT) anode.

For Step 6 of rectification of fields and collection of electrons, FIG. 12 illustrates how the carbon nanotube (CNT) anode generates ballistic electrons toward the +charges induced on the metal cathode by the SPP excitations produced by photons of the input concentrated sunlight. Generation of ballistic electrons is expected based on the observation that the combination of the 100× increase in the electric field strength due to the optical concentrator, a 3,000× increase in the electric field strength due to the localized SPP modes in voids of the metal layer, and the 500× field enhancement of the electric field at the CNT electrode tip, which is in close proximity to the evanescent component of the localized SPP.

Using these estimates of the field enhancements, the approximate total field strength between the CNT electrode and the metal cathode, assuming a peak intensity of incident sunlight at the Earth's surface is $I=1,000$ Wp/m$^2$, then the average electric field is $I=E_o^2 I(2\eta)$, where the impedance of free space $\eta=377$ ohms, and $Eo=10^{-6}$ V/nm. The total field at the CNT tip is expected to be $E_{tot}=(10^{-6}$ V/nm$)\times(100)\times(3,000)\times(500)$, or about 150 V/nm. In practice, this would be an upper limit, and if only 10% could be achieved, it would still be greater than the required 1 V/nm threshold needed for field emission from a metal cathode. This means that even in dim sunlight, due to poor atmospheric conditions, the described SUPER cell should be able to induce the release of ballistic electrons by field emissions.

Figure 13:
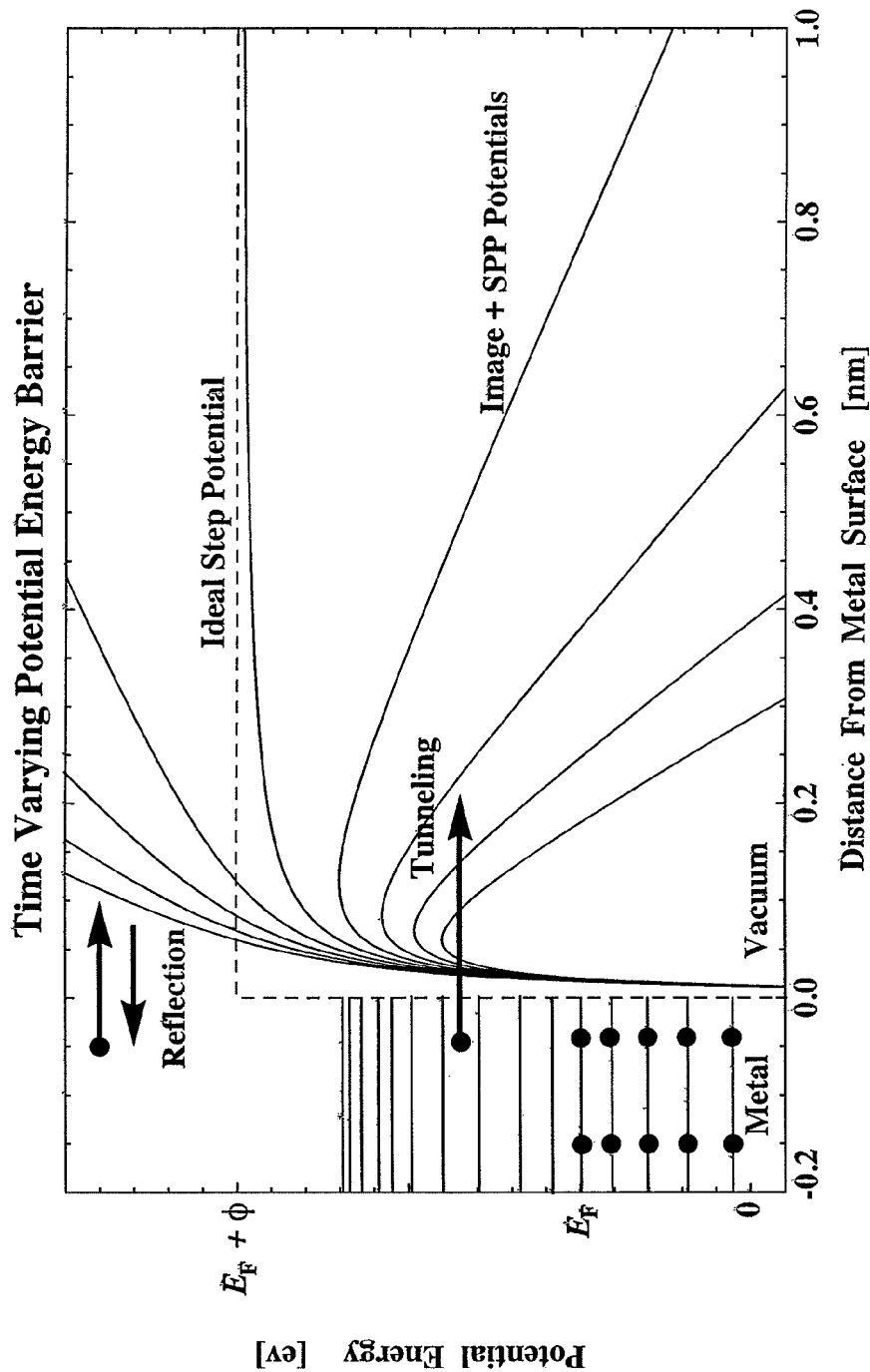
FIG. 13 illustrates how rectification of SPP standing wave excitation results in an electrical current output from field emissions of electrons through quantum tunneling.

FIG. 13 illustrates rectification through field emission of electrons in a quantum tunneling state. An approximately triangular-shaped potential barrier exists in the tunneling state that changes its shape sinusoidally between triangular and almost an infinite potential wall with the variation of the incident optical field. The localized SPP state in the metallic cavity is a standing wave, and on each half oscillation the time varying potential between the metal cathode and the CNT anode is sufficient to allow quantum mechanical tunneling of electrons for a DC output current every half cycle of light. A DC bias of a gate electrode between anode and cathode may be optionally introduced to optimize the effect and maximize power extracted. A more detailed discussion of the quantum tunneling effect is provided by G. Fursey, "Field Emission in Vacuum Microelectronics (Microdevices)", Springer, 2005 (ISBN-0306474506).

The SUPER cell is essentially an array of resonant cavities at a nano-scale (called "plasmonotrons") that functions like millions of nano-scale "vacuum tubes" as diodes for rectification of sunlight into electricity. The sunlight is concentrated and directed onto an array of cavities located just under the metal surface. Then SPP states are created on the vacuum tubes walls and ultimately rectified into electricity by field emssion and quantum tunneling across the cathode-anode gap.

Conventional vacuum tubes use inefficient thermionic emission to boil off electrons for use as the carrier. The governing equation of a vacuum tube filament current "I" takes the form of the Richardson-Dushman equation $I=aT^2 e^{-b/T}$, where a and b are constants of the material and T is the absolute temperature. Making a filament hot is energy inefficient. In contradistinction, the SUPER cell uses lossless field emission. In the process of field emission the emission current is given by the Fowler-Nordheim equation $I=cV^2 e^{-d/V}$, where V is the local voltage potential difference relative to ground and the coefficients c and d depend on the materials and geometry used. This allows for electron emission without waste heat. A diode made from nano-vacuum-tube technology is essentially a perfect diode. It has no "turn-on voltage" as a semiconductor diode requires. Moreover, just as in traditional circuit design both half-wave and full-wave rectification are possible. Its efficiency is governed by near perfect absorption of light into SPP states as well as the statistical properties of rectifying black body radiation. The SUPER cell may be operated as a linear and reciprocal device or it can be induced to be a non-reciprocal device by the addition of non-reciprocal materials, such as ferromagnetic cobalt, into the metal MM1, and magnetic fields (B-fields) through MM1. This spoils the process of normal local thermodynamic detailed-balance that limits efficiency and allows scattered SPP excitations a longer time within the metal layer MM1 before becoming a radiative loss. The material MM1 is often taken to be a noble metal like silver or gold but other notable materials, like tungsten, are also useful when the SUPER cell becomes very hot during operation—especially when the SUPER cell is used as a Thermo Photovoltaic (TPV) cell instead of just a solar photovoltaic (PV) cell.

A theoretical maximum performance of a SUPER cell for broad-band sunlight is about 84% if: (1) it contains an array of plasmonotrons that are tuned across the solar spectrum, and (2) control is exercised over SPP back-scattering using techniques from the emerging field of non-reciprocal plasmonics. Each plasmonotron has a controllable cathode Fermi-level (chemical potential), work function, resonance energy, and bandwidth. These three characteristics, especially the non-zero Fermi-level and work function define a quantum device.

A further refinement is to form the plasmonotron cavities in groups with units of varying diameters corresponding to different wavelength spectra of the input sunlight. The diameters of the cavities are chosen so that the bandwidths of neighboring cavities slightly overlap and form an overall band that is larger than the solar spectrum so that temperature changes and the resulting changes in cavity sizes do not adversely impact the ability of the array to collect solar energy. The optimum packing of the cavities is hexagonal as this is the best space filling array possible. The total array of cavities may be arranged in a suitable array configuration, such as a parallelogram or hexagonal shape, with the groups of varying cavities filling the array. The use of multiple plasmonotron devices each tuned to a slightly different part of the spectrum can in theory obtain an upper limit of about 68% at one sun of concentration and 84% at 10,000 suns of concentration.

As the SUPER cell is formed at nano scale, each spherical void may be on the order of a wavelength in scale, and there may be approximately 10 million CNT electrodes on a 1 $mm^2$ SUPER cell. One or more ferromagnetic layers such as made of cobalt may be included as part of the metal layer film. A strong rare-earth magnet, also on the order of 1 $mm^2$, may be used to magnetically bias the system. This configuration would not allow radiation to easily scatter back in the direction it came from so that multiple interactions of SPP states with the CNT anode array may occur, thereby increasing the probability of conversion to electrical energy.

Figure 14:
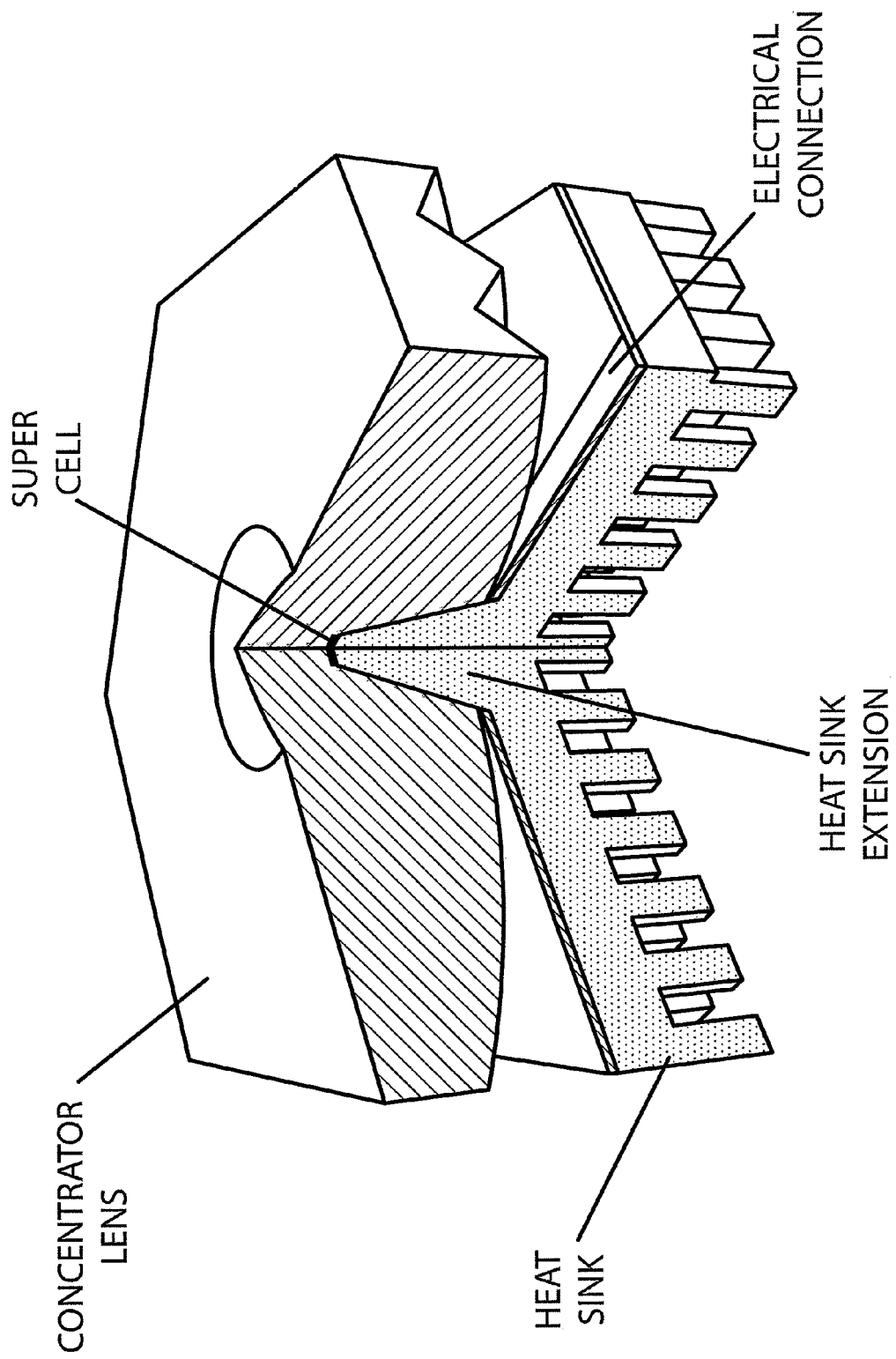
FIG. 14 illustrates one complete unit of a solar concentrator lens with a SUPER cell at its focal target.

For Step 7 of obtaining a direct energy flow output through integration with non-reciprocal devices, FIG. 14 illustrates a complete unit of a solar concentrator lens with a SUPER cell at its focal target. A square meter of collection area can be covered with tiling of about 650 of the hexagonal concentrator lenses. A sun tracking front-end system such as illustrated in FIG. 2C can be provided over the tiled array of concentrator lenses. Each concentrator lens is designed to operate at 4096-suns of concentration and is further configured so that it operates at the thermodynamic limit of performance for the given specific input and output acceptance angle. Each concentrator lens would have an input area of about 1024 $mm^2$ providing input light at 4096-suns concentration to a SUPER cell with dimensions of about 0.5 mm×0.5 mm. The total collected energy per lens is thermally manageable, of the order of high brightness LED technology, and most of the energy is being converted to electricity not heat. A heat sink is provided for heat conducted from the SUPER cell by a heat pipe. The SUPER cell provides a direct flow of electricity as an output to an electrical connection. The small SUPER cell area enables nano-fabrication techniques to be used for manufacturing while still maintaining low cost and eventual scaling by Moore's law.

The described energy conversion device can thus provide direct conversion of concentrated sunlight into electricity at very high efficiencies up to a theoretical maximum of about 84%. For a field installation employing this process, an overall sun conversion panel efficiency near 70% may be obtainable. In the solar industry, the benchmark for standard insolation energy of full sunlight is 1000 W per square meter. Compared to conventional photovoltaic panels with polysilicon cells that have a conversion efficiency at a high end of about 15% to 20% and can obtain a peak output of about 150 to 200 Wp per square meter of panel, the energy conversion device at 70% efficiency could obtain a peak output of about 700 Wp per square meter of panel.

The use of a high-performance sun tracker and optical concentrator can concentrate input sunlight to the equivalent of 4,096 suns onto a SUPER cell with dimensions of about 0.5 mm×0.5 mm with resonator cavities fabricated at the nano-scale. The ultra-efficient sunlight conversion process making extremely parsimonious use of converter materials can lower the levelized costs of solar-generated electricity dramatically and enable widespread deployment of flat, low-profile, ultra-efficient solar panels. Cost levels of 40-50 cents per watt may be achievable for systems at 100 MWp (MW peak) production scales per year. Using as an example the maximum average solar insolation data for the desert Southwest of the U.S., a 70% efficient 100 MWp system would be equivalent to about 143,000 1 $m^2$ solar collector panels, and the average total energy delivered per system per year may be in the range of 256 GWh/yr. This amount of energy from a 100 MWp electricity conversion system would be equivalent to 31,000 tons of coal used per year and 251,000 tons of $CO_2$ emitted per year from a typical coal power plant, or 151,000 barrels of oil and 48,000 tons of $CO_2$ for an oil-fired plant.

For the energy conversion system to provide a constant output despite variability of sunlight, the SUPER cell can be combined with suitable system energy storage. The Carbon Nano-Tube anodes can be coupled to a layer of Ultra-Capacitor circuits for interim storage of excess electrical energy converted from solar energy. The Ultra-Capacitor layer may be formed as a back panel taking up the entire back-side of the solar input panel, and having thickness proportional to the energy density that is desired for storage. By joining a high-capacity storage of Ultra Capacitors to the solar panel, the combined solar panel system could provide electrical output even at night. Other energy storage media like LiOn batteries may be used instead.

Other variations that may be developed include forming the SPP resonator cavities to contain multiple anodes and component cathodes, providing metallic tuning stubs above the dielectric-metal interface to change the effective capacitance and inductance of the SPP resonator cavity to allow multi-pole tuning, and employing more than one layer of SPP resonator cavities. A hybrid of photonic and plasmonic crystals may be used to control light on the same chip. Photonic crystals and photonic band gap materials may be used for momentum coupling from a homogenous medium to a thin metal film to support SPP modes.

The energy conversion device described herein may be used for other applications of converting light into electricity. For example, small-scale SUPER cells may be used with IC circuits for converting ambient light or nighttime illumination into useful electrical output to power field sensors and equipment and other remotely deployed devices. Sunlight conversion cells may also be used on the exterior of vehicles to collect energy from the sun when the vehicle is parked in order to charge the vehicle's batteries or even when the vehicle is in use. This is especially useful for hybrid-electric cars or other electric cars that have an extensive electrical energy system onboard.

It is understood that many modifications and variations may be devised given the above description of the principles of the invention. It is intended that all such modifications and variations be considered as within the spirit and scope of this invention, as defined in the following claims.

The invention claimed is:

1. An energy conversion device for converting light into electricity comprising:
   (a) a first dielectric medium for enabling input light propagation therein,
   (b) a first metallic medium in physical contact with said first dielectric medium,
   (c) a dielectric-metal interface common to said first dielectric medium and said first metallic medium,
   (d) an array of surface-plasmon-polariton (SPP) resonator cavities formed at a nano-scale and distributed in said first metallic medium below said dielectric-metal interface,
   (e) each resonator cavity having a spherical interior structure configured to allow an approximately angle-independent and polarization-independent means of exciting SPPs, which encompasses a hollow interior so as to form a metal cathode in said first metallic medium, and a metal anode disposed within the hollow interior which is electrically isolated from said metal cathode and said first metallic medium,
   (f) a second metallic medium coupled in electrical contact with the anodes of said SPP resonator cavities, and
   (g) a second dielectric medium forming electrical insulation between said first metallic medium and said second metallic medium,
   wherein each said cathode is spaced by a nano-scale gap from its respective anode such that input light propagating in said first dielectric medium is converted into standing waves of SPP excitations within said SPP resonator cavities below said dielectric-metal interface, and
   wherein said spherical SPP resonator cavities are configured to enhance electric field interactions of standing waves of SPP excitations within said SPP resonator cavities to exceed a threshold needed for quantum field emission so that electrons are driven out of said cathode by the standing waves of SPP excitations into ballistic electrons that escape from said cathode and pass across said nano-scale gap to said anode which is coupled by said second metallic medium to an electrical output circuit.

2. The energy conversion device in claim 1, wherein said first metallic medium is formed with a thin surface layer at the dielectric-metal interface that has a 3-dimensional patterning for providing a momentum kick in the plane of the dielectric-metal interface to convert photons into SPP excitations states.

3. The energy conversion device in claim 1, wherein said patterned surface layer is formed with an array of apertures or voids positioned over the SPP resonator cavities so that the cavities are not totally enclosed.

4. The energy conversion device in claim 1, wherein said first metallic medium includes a ferromagnetic material for the purpose of reducing scattering losses.

5. The energy conversion device in claim 1, wherein said first metallic medium is formed with regions of noble metal and ferromagnetic material for reducing scattering losses.

6. The energy conversion device in claim 1, wherein at least one of said anode and said cathode is formed as a carbon nano-tube.

7. The energy conversion device in claim 1, wherein said SPP resonator cavities are formed in a plurality of diametral sizes corresponding to component light wavelengths to allow full spectrum energy conversion of broadband light input.

8. The energy conversion device in claim 1, wherein a gate electrode biased with a bias voltage is used to control the flow of electrons from the cathode to the anode.

9. The energy conversion device in claim 1, further comprising means for inducing a static magnetic field through said device to control SPP loss scattering.

10. The energy conversion device in claim 1, wherein the input light is sunlight and energy conversion efficiencies up to a theoretical maximum of 84% are obtained.

11. The energy conversion device in claim 1, wherein the input light is blackbody radiation from a high temperature source.

12. The energy conversion device in claim 10, further comprising a sun tracking system for redirecting incoming sunlight along an input light propagation path.

13. The energy conversion device of claim 12, wherein said sun tracking system has an array formed by top and bottom transparent stators which encapsulate a row of cylindrical rotors formed with top and bottom transparent halves arranged in parallel, wherein the top and bottom stators and rotors have matched refractive indices designed to refract incoming sunlight along a predetermined light propagation path.

14. The energy conversion device of claim 13, further comprising steering mechanisms for said cylindrical rotors formed by stator electrodes in patterned arrays of transparent, thin-film transistors.

15. The energy conversion device of claim 10, further comprising an optical concentrator for concentrating incoming sunlight down to a focal target of said energy conversion device.

16. The energy conversion device of claim 15, wherein said optical concentrator has a concentrator lens configured with shaped radial facets which redirect incoming sunlight by total internal reflection and focus it down to the focal target of said energy conversion device.

17. The energy conversion device of claim 16, wherein said optical concentrator is configured to obtain a concentration factor in the range up to 10,000 suns.

18. The energy conversion device of claim 16, wherein said device is formed with a surface area for input of concentrated sunlight in the range of about 1 mm$^2$.

* * * * *